(12) United States Patent
Kitamura

(10) Patent No.: US 7,312,133 B2
(45) Date of Patent: Dec. 25, 2007

(54) METHOD OF MANUFACTURING SEMICONDUCTOR DEVICE

(75) Inventor: Akio Kitamura, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 45 days.

(21) Appl. No.: 11/075,022

(22) Filed: Mar. 8, 2005

(65) Prior Publication Data
US 2005/0153527 A1     Jul. 14, 2005

Related U.S. Application Data

(62) Division of application No. 10/151,689, filed on May 20, 2002, now Pat. No. 7,049,202.

(30) Foreign Application Priority Data

May 18, 2001   (JP)   ............................. 2001-148658

(51) Int. Cl.
    *H01L 21/76*   (2006.01)
(52) U.S. Cl. ................. 438/430; 438/424; 257/E21.42; 257/E21.418
(58) Field of Classification Search ................ 438/406, 438/484, 524, 424, 427, 430, 218, 223; 257/E21.56, 257/E21.418, E21.42, E21.551
    See application file for complete search history.

(56) References Cited

U.S. PATENT DOCUMENTS

| 5,844,275 | A | 12/1998 | Kitamura et al. | |
|---|---|---|---|---|
| 6,436,790 | B2 | 8/2002 | Ito | |
| 6,624,016 | B2 | 9/2003 | Wu | |
| 6,730,961 | B2 | 5/2004 | Kitamura | |
| 6,861,702 | B2 | 3/2005 | Kitamura | |
| 2001/0041419 | A1* | 11/2001 | Ito | 438/424 |
| 2001/0055861 | A1* | 12/2001 | Patti et al. | 438/524 |
| 2002/0034708 | A1* | 3/2002 | Tseng | 438/524 |
| 2002/0115270 | A1* | 8/2002 | Wu | 438/484 |

FOREIGN PATENT DOCUMENTS

JP         61-260676 A      11/1986

(Continued)

*Primary Examiner*—Walter Lindsay, Jr.
(74) *Attorney, Agent, or Firm*—Rossi, Kimms & McDowell, LLP

(57) ABSTRACT

A method of manufacturing a lateral trench-type MOSFET exhibiting a high breakdown voltage and including an offset drain region around a trench. Specifically, impurity ions are irradiated obliquely to the side wall of a trench to implant the impurity ions only into to the portion of a semiconductor substrate along the side wall of trench, impurity ions are irradiated in parallel to the side wall of trench to implant the impurity ions only into to the portion of semiconductor substrate beneath the bottom wall of trench; the substrate is heated to drive the implanted impurity ions to form an offset drain region around trench and to thermally oxidize semiconductor substrate to fill the trench 2 with an oxide. Alternatively, the semiconductor substrate is oxidized to narrow trench with oxide films leaving a narrow trench and the narrow trench left is filled with an oxide. Still alternatively, a plurality of trenches is formed, the trenches are filled with an oxide and the extended portion of semiconductor substrate extended between the adjacent trenches is converted to an oxide film by thermal oxidation.

8 Claims, 31 Drawing Sheets

FOREIGN PATENT DOCUMENTS

| | | |
|---|---|---|
| JP | 64-51662 A | 2/1989 |
| JP | 2-180074 A | 7/1990 |
| JP | 3-4560 A | 1/1991 |
| JP | 3-44076 A | 2/1991 |
| JP | 5-110072 A | 4/1993 |
| JP | 5-190663 A | 7/1993 |
| JP | 5-299648 A | 11/1993 |
| JP | 6-97450 A | 4/1994 |
| JP | 7-74352 A | 3/1995 |
| JP | 9-321291 A | 12/1997 |
| JP | 11-238791 A | 8/1999 |
| JP | 2000-150877 A | 5/2000 |
| JP | 2001-36071 A | 2/2001 |

* cited by examiner

METHOD OF MANUFACTURING SEMICONDUCTOR DEVICE

CROSS-REFERENCE TO RELATED APPLICATION

This application is a divisional of U.S. application Ser. No. 10/151,689 filed on May 20, 2002 now U.S. Pat. No. 7,049,202.

DETAILED DESCRIPTION OF THE INVENTION

The present invention relates to a method of manufacturing a semiconductor device having a trench structure. Specifically, the present invention relates to a method of manufacturing a semiconductor structure which facilitates constructing MOSFET's exhibiting a high breakdown voltage and used for power IC's.

Various techniques for forming trenches have been investigated to obtain SOI techniques for forming a capacitor in DRAM's, and for separating unit devices and to obtain trench gate techniques for discrete MOSFET's. Recently, application of these trench techniques to lateral MOSFET's exhibiting a high breakdown voltage and used for power IC's has been proposed. One of the trench structures for the lateral high-breakdown-voltage MOSFET's includes an offset drain region around a trench. For forming an offset drain region around a trench, it is necessary to establish a technique for implanting impurity ions into the portion of a semiconductor substrate around the trench at an appropriate concentration and a technique to bury an oxide film and such an insulator film in the wide trench.

However, any practical and effective ion implantation technique for forming an offset drain around a trench or any practical and effective technique for filling the trench with an oxide film has been neither proposed nor reported.

In view of the foregoing, it would be desirable to provide a method of manufacturing a semiconductor device such as a lateral trench-type MOSFET exhibiting a high breakdown voltage and including an offset drain region around a trench, the method including the steps of implanting impurity ions into the portion of the semiconductor substrate around the trench at an appropriate concentration and filling the wide trench with an oxide film.

SUMMARY OF THE INVENTION

In accordance with a first aspect of the invention for manufacturing a semiconductor device having a trench structure, an offset drain region is formed around a trench in the following way. After forming the trench, impurity ions are irradiated obliquely to the side wall of the trench at the angle, at which the side wall of the trench is not shaded but the bottom wall of the trench is shaded. Then, impurity ions are irradiated in perpendicular to the bottom wall of the trench, that is in parallel to or at zero degrees of angle with the side wall of the trench. Then, the implanted impurity ions are driven and activated by thermal treatment.

Since the impurity ions are implanted only into the portion of the semiconductor substrate along the side wall of the trench by the oblique ion implantation, and since the impurity ions are implanted only into the portion of the semiconductor substrate beneath the bottom wall of the trench by the parallel ion implantation, the impurity concentration in the portion of the semiconductor substrate along the side wall of the trench and the impurity concentration in the portion of the semiconductor substrate beneath the bottom wall of the trench are optimally controlled independently.

In accordance with a second aspect of the invention for manufacturing a semiconductor device having a trench structure, an offset drain region is formed around the trench or the trenches formed in advance by depositing an electrically conductive film of the conductivity type same with that of the offset drain region in the trench or the trenches and by diffusing the impurity contained in the electrically conductive film through solid phase diffusion into the portions of the semiconductor substrate adjacent the side wall and the bottom wall of each trench.

By the manufacturing method according to the second aspect of the invention, an impurity diffusion layer is formed with excellent controllability in the portions of the semiconductor substrate adjacent to the side wall and the bottom wall of each trench. By adjusting the impurity concentration in the electrically conductive film, the thickness of the electrically conductive film and the driving period of time, the impurity concentration in the offset drain region is controlled optimally.

In accordance with a third aspect of the invention for manufacturing a semiconductor device having a trench structure, the trench thereof narrow enough is filled with the oxide film formed by thermally oxidizing the semiconductor substrate. When the trench is too wide to be filled with an oxide film formed by thermally oxidizing the semiconductor substrate, the wide trench is narrowed by the oxide films formed by thermally oxidizing the semiconductor substrate leaving a narrow trench and the narrow trench left is filled with an oxide. Alternatively, a plurality of trenches are formed in the semiconductor substrate leaving an extended portion of the semiconductor substrate, thin enough to be converted to an oxide film, between the adjacent trenches, the trenches are filled with thermal oxide films or by depositing an oxide, and the extended portion of the semiconductor substrate is converted to an oxide film by thermal oxidation.

The trench narrow enough is filled with an oxide film only by thermal oxidation. When the trench is too wide to be filled with a thermal oxide film, the wide trench is filled with the oxide films and the oxide deposited after forming the oxide films. Alternatively, a plurality of narrow trenches are filled with oxide films (oxide) and the extended portion of the semiconductor substrate extended between the adjacent narrow trenches is converted to an oxide film by thermal oxidation, resulting in a wide trench formed from a plurality of narrow trenches. The resulting wide trench is filled with an oxide film (oxide).

BRIEF DESCRIPTION OF THE DRAWINGS

The invention will be explained in detail hereinafter with reference to the accompanied drawing figures which illustrate the preferred embodiments of the invention, wherein.

DETAILED DESCRIPTION OF THE PREFERRED EMBODIMENTS

First Embodiment

Figure 1:
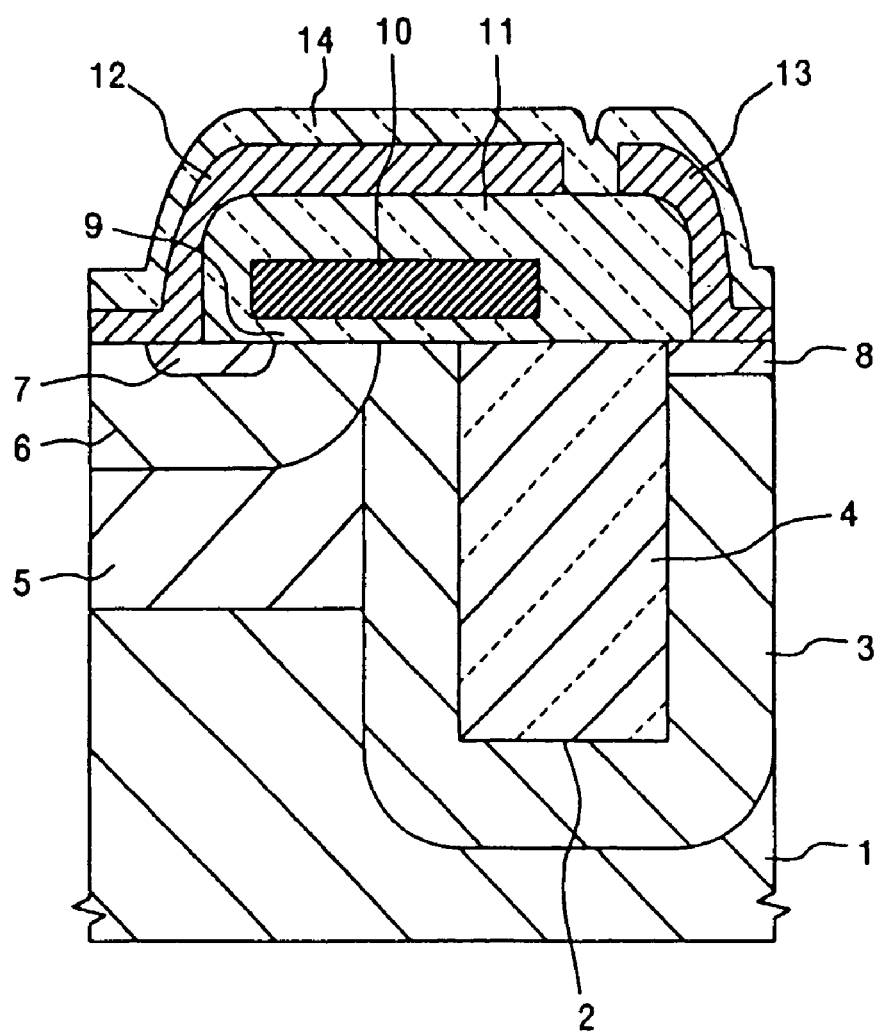
FIG. 1 is the cross sectional view of a semiconductor device manufactured by a manufacturing method according to the first embodiment of the invention.

FIG. 1 is the cross sectional view of a semiconductor device manufactured by a manufacturing method according to a first embodiment of the invention. Referring now to FIG. 1, the semiconductor device is a lateral trench type MOSFET, which includes a p-type semiconductor substrate 1, a trench 2, an n$^-$-type offset drain region 3, an insulator 4 filling trench 2, a p-type well region 5, a p-type base region 6, an n$^+$-type source region 7, an n$^+$-type drain region 8, a gate oxide film 9, a gate electrode 10, an interlayer insulation film 11, a source electrode 12, a drain electrode 13, and a passivation film 14.

Trench 2 is in the surface portion of semiconductor substrate 1. Trench 2 is formed from the surface of semiconductor substrate 1 and filled with insulator 4. The n$^-$-type offset drain region 3 is around trench 2, namely, n$^-$-type offset drain region 3 surrounds the side wall and the bottom wall of trench 2. The p-type well region 5 is in the surface portion of semiconductor substrate 1 on the source side spaced apart from trench 2 for n$^-$-type offset drain region 3. The p-type well region 6 is in the surface portion of p-type well region 5. The n$^+$-type source region 7 is in the surface portion of p-type well region 6 and spaced apart from n$^-$-type offset drain region 3.

The n$^+$-type drain region 8 is in the surface portion of n$^-$-type offset drain region 3 on the drain side of trench 2 (opposite to the source side). Gate oxide film 9 is formed from the surface of n$^+$-type source region 7 to the surface of n$^-$-type offset drain region 3 on the source side. Gate electrode 10 is on gate oxide film 9. Source electrode 12 is in electrical contact with p-type well region 6 and n$^+$-type source region 7. Drain electrode 13 is in electrical contact with n$^+$-type drain region 8. Passivation film 14 covers the entire semiconductor structure described above.

Figure 2:
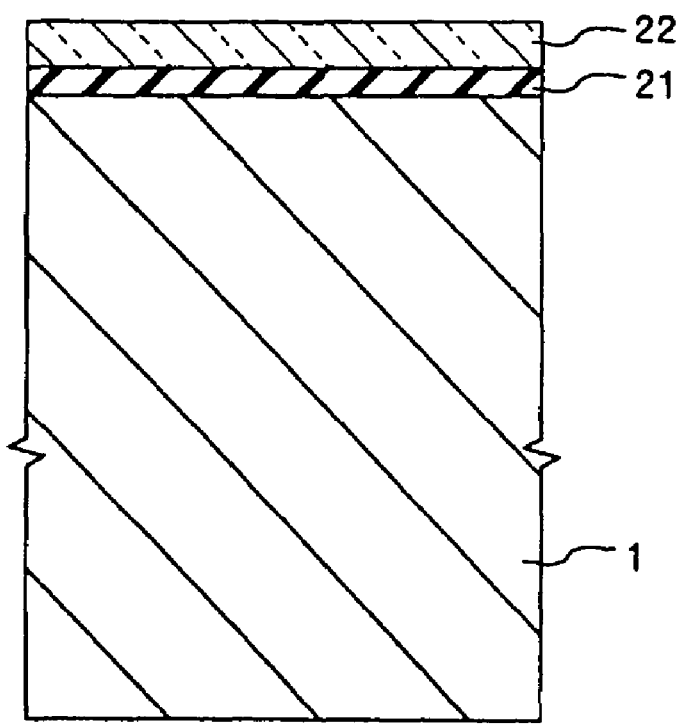
FIG. 2 is a cross sectional view describing the steps of forming an oxide film and forming a nitride film on a semiconductor substrate according to the first embodiment.
Figure 3:
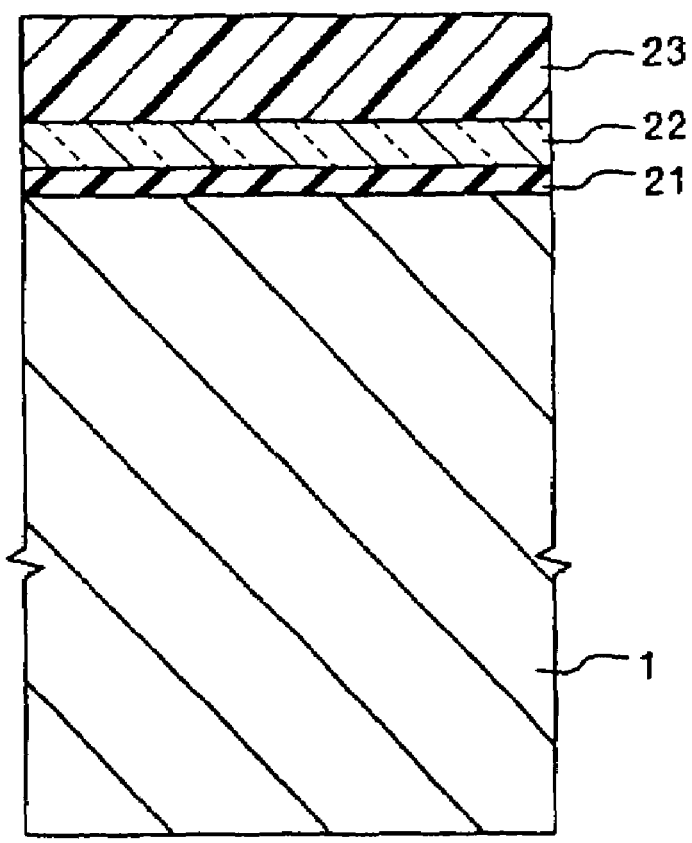
FIG. 3 is a cross sectional view describing the step of coating a resist on the nitride film according to the first embodiment.
Figure 4:
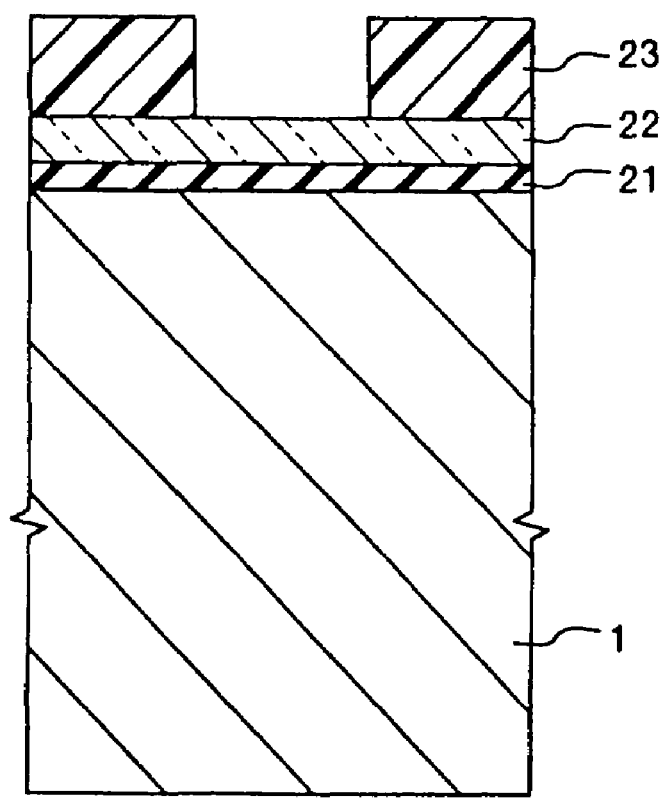
FIG. 4 is a cross sectional view describing the step of removing the portion of the resist, below which a trench will be formed, according to the first embodiment.
Figure 5:
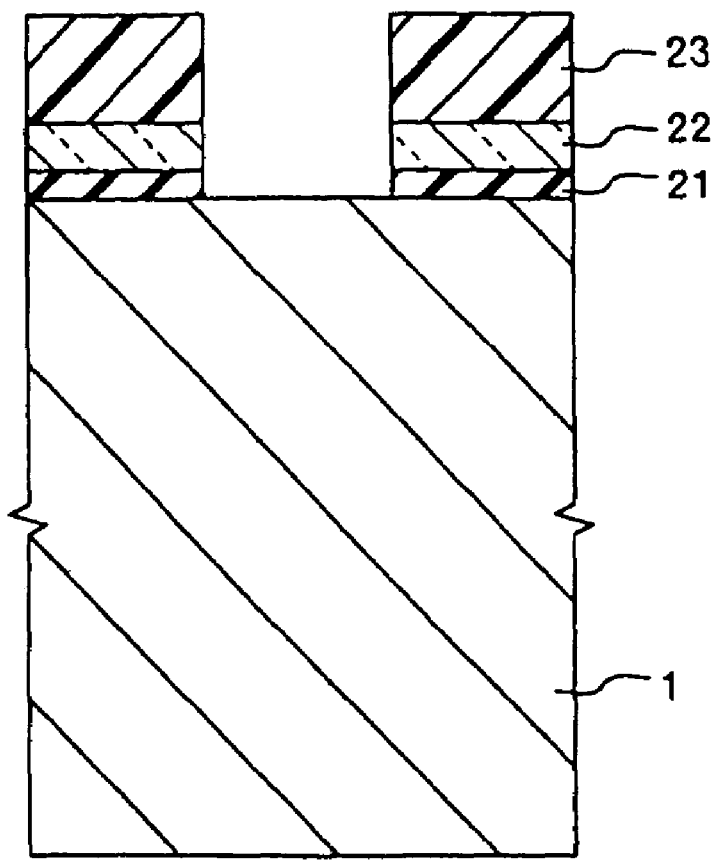
FIG. 5 is a cross sectional view describing the step of removing the portions of the nitride film and the oxide film, below which the trench will be formed, according to the first embodiment.
Figure 6:
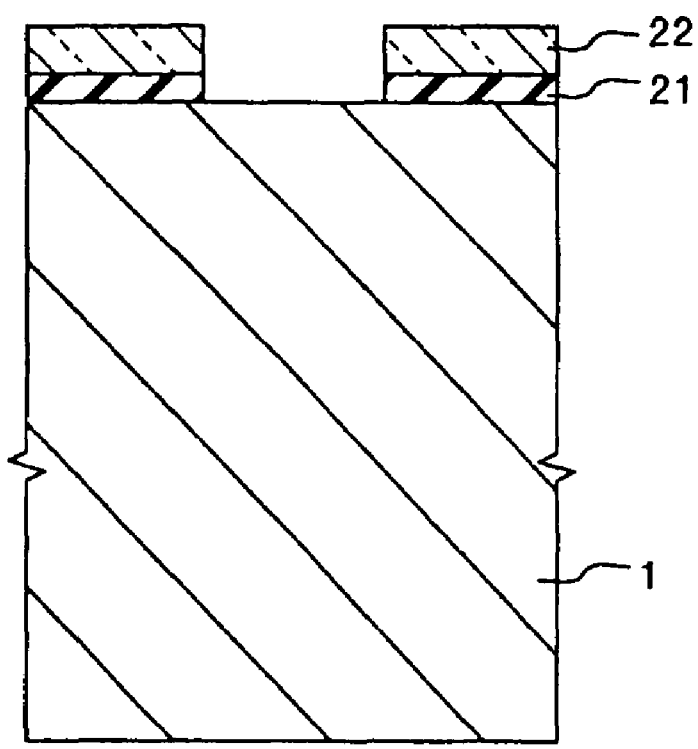
FIG. 6 is a cross sectional view describing the step of removing the remaining rest according to the first embodiment.
Figure 7:
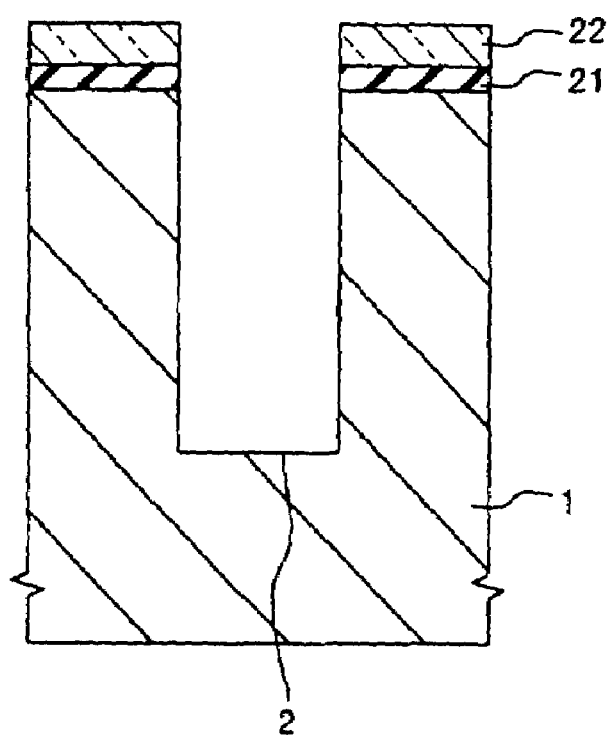
FIG. 7 is a cross sectional view describing the step of forming a trench according to the first embodiment.
Figure 8:
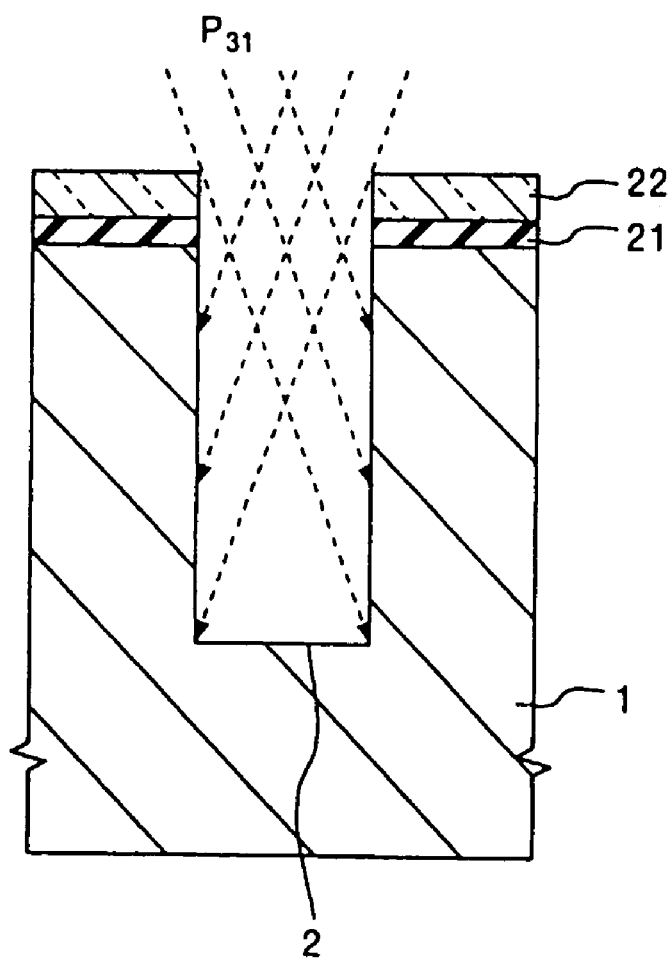
FIG. 8 is a cross sectional view describing the step of oblique ion implantation according to the first embodiment.

Now a first process for manufacturing the semiconductor device shown in FIG. 1 will be described with reference to FIGS. 2 through 13, each describing the structure of the semiconductor device in each manufacturing step. Referring now to FIG. 2, an oxide film 21, e.g. 300 Å in thickness, is formed on a p-type substrate 1 by oxidizing the surface of p-type substrate 1. Then, a nitride film 22, e.g. 1000 Å in thickness, is deposited on oxide film 21. As shown in FIG. 3, a resist 23 is coated on nitride film 22. A portion of resist 23, below which a trench 2 will be formed, is removed by exposing the portion of resist 23 and by developing the exposed portion of resist 23, as illustrated in FIG. 4. Referring now to FIG. 5, the portions of nitride film 22 and oxide film 21, below which trench 2 will be formed, are removed by etching using the remaining resist 23 as a mask to expose the surface of substrate 1, from which trench 2 will be dug. Resist 23 is burned to ashes and removed as illustrated in FIG. 6. As shown in FIG. 7, a trench 2, 5 microns in width and 20 microns in depth, is formed in perpendicular to the surface of substrate 1 by etching silicon substrate 1 using the remaining nitride film 22 and oxide film 21 as a mask. Phosphorus ions ($P_{31}$) are implanted obliquely to the surface of substrate 1 as shown in FIG. 8.

For example, the dose amount of the phosphorus ions is $8 \times 10^{12}$ cm$^{-2}$. The ion implantation direction is at 14 degrees of angle with the normal of the substrate surface, that is the side wall of trench 2. Once the angle between the ion implantation direction and the normal of the substrate surface is determined, impurity ions are irradiated at the determined angle to the substrate rotating around the normal of the substrate surface. Thus, impurity ions are implanted into the entire portion of substrate 1 adjacent to the side wall of trench 2.

The ion implantation angle with the normal of the substrate surface is given by tan (W/L), where W is the width of trench 2 and L the depth of trench 2. The phosphorus ions irradiated at the angle described above are implanted only to the portion of substrate 1 along the side wall of trench 2, since the portion of substrate 1 along the side wall of trench 2 is not shaded from the phosphorus ions irradiated at the angle described above. Since the bottom wall of trench 2 is shaded by the portion of substrate 1 along the side wall of trench 2, the phosphorus ions irradiated at the above described angle do not reach the bottom wall of trench 2. Therefore, the ion implantation angle is changed with the width and the depth of trench 2.

Figure 9:
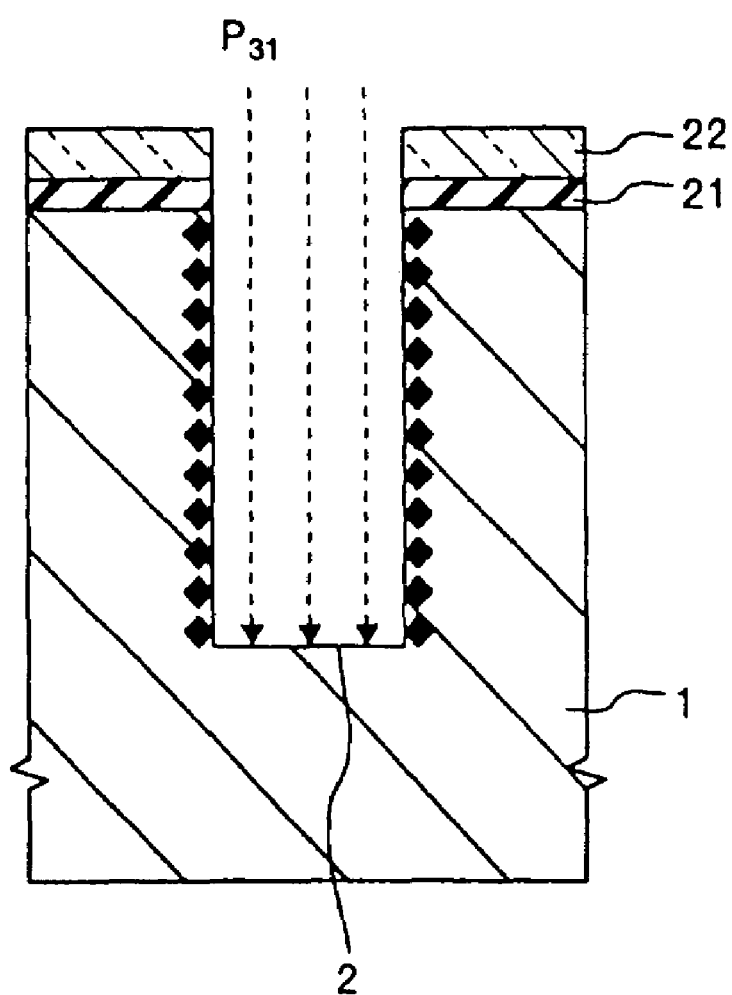
FIG. 9 is a cross sectional view describing the step of parallel ion implantation according to the first embodiment.
Figure 10:
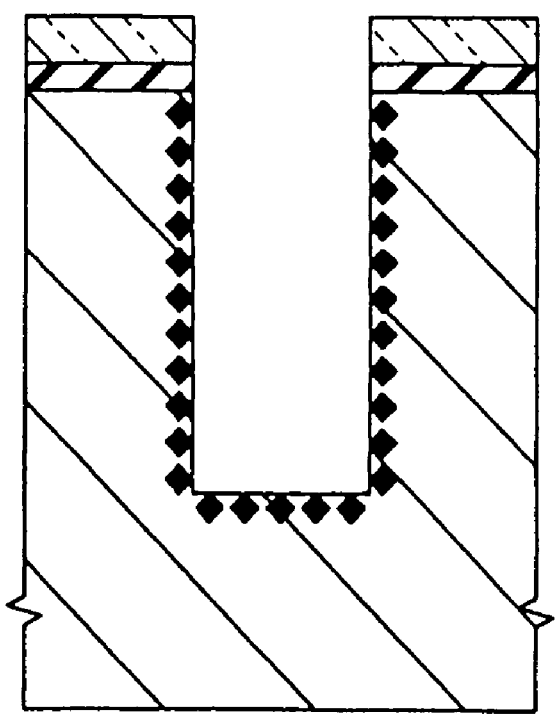
FIG. 10 is a cross sectional view schematically showing the distribution of the implanted impurity atoms according to the first embodiment.

Proceeding now with the manufacturing process, phosphorus ions are implanted in perpendicular to the substrate surface, that is at 0 degrees of angle with (parallel to) the side wall of trench 2 as illustrated in FIG. 9. As shown in FIG. 10, the phosphorus ions are implanted only into the portion of substrate 1 beneath the bottom wall of trench 2. To equalize the resultant surface impurity concentration in the portion of n$^-$-type offset drain region 3 beneath trench 2 with the resultant surface impurity concentration in the portion of n$^-$-type offset drain region 3 along the side wall of trench 2, the dose amount of the phosphorus ions in the portion of substrate 1 beneath the bottom wall of trench 2 is set at a value (W/L) times as high as the dose amount of the phosphorus ions in the portion of substrate 1 along the side wall of trench 2. In detail, the dose amount of the phosphorus ions at the parallel implantation is $2 \times 10^{12}$ cm$^{-2}$. Since any phosphorus ion is not implanted to the portion of substrate 1 beneath the bottom wall of trench by the oblique implantation, any portion heavily doped with phosphorus ions locally is not caused beneath trench 2.

Figure 11:
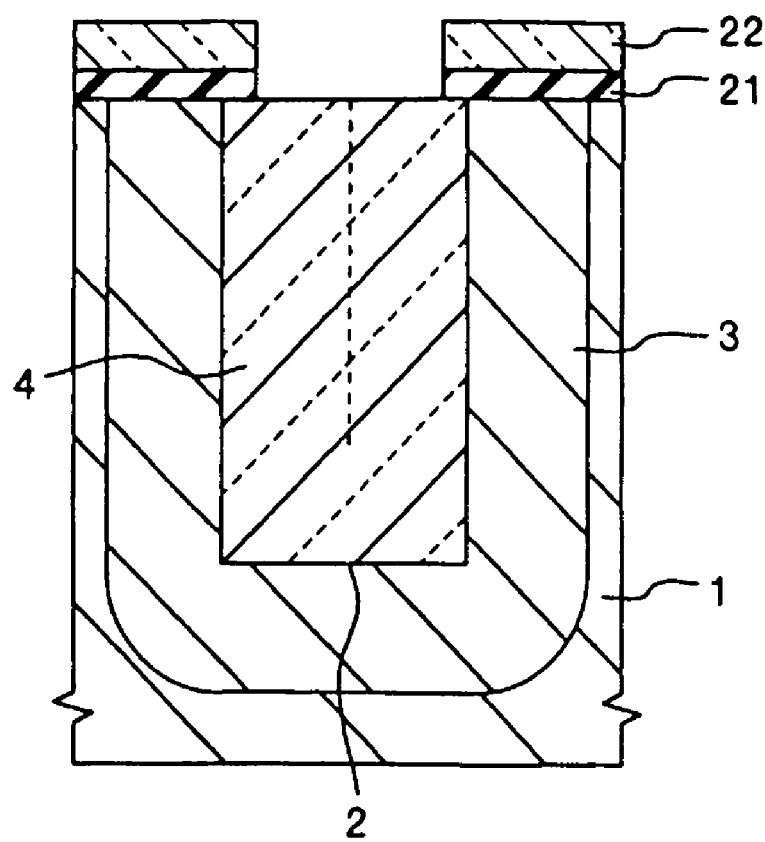
FIG. 11 is a cross sectional view describing the steps of forming an offset drain region around the trench and forming an oxide film in the trench according to the first embodiment.

Referring now to FIG. 11, the implanted phosphorus ions are thermally driven such that the diffusion depth xj is around 6 microns, resulting in an n$^-$-type offset drain region 3. At the same time, thermal oxide films are formed on the side wall and the bottom wall of trench 2. The thermal oxide films are, for example, 4 microns in thickness. The broken line in FIG. 11 represents a virtual boundary, at which the thermal oxide films growing from the side wall and the bottom wall of trench 2 join.

Figure 12:
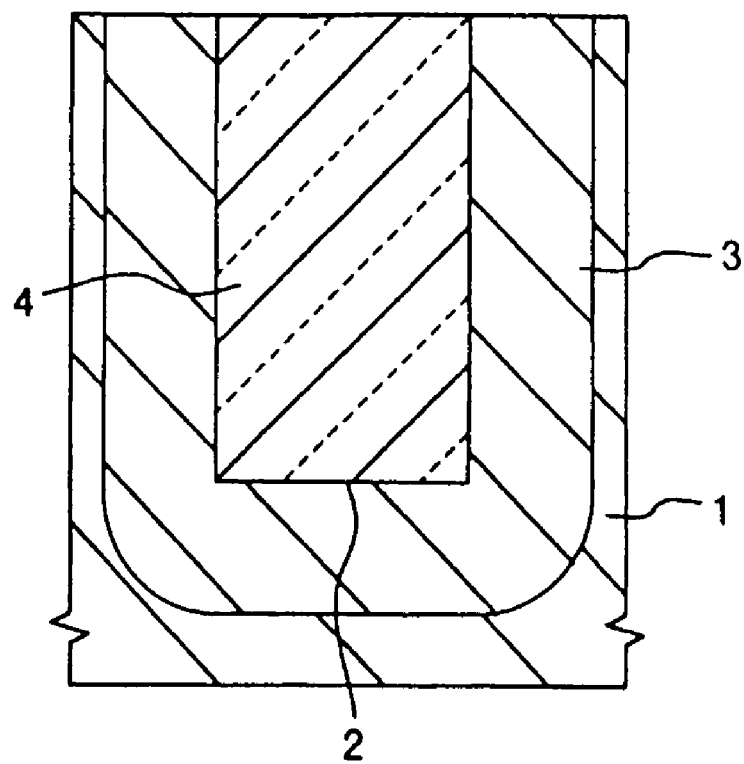
FIG. 12 is a cross sectional view describing the step of removing the nitride film and the oxide film from the substrate surface according to the first embodiment.
Figure 13:
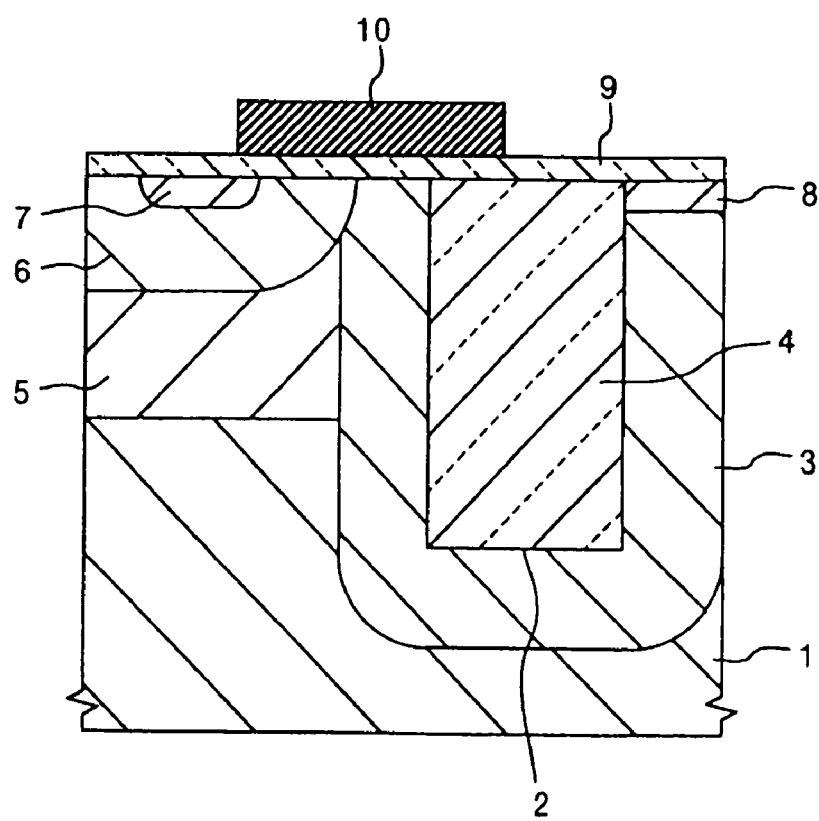
FIG. 13 is a cross sectional view showing the semiconductor device including the gate electrode formed on the completed semiconductor structure according to the first embodiment.

Continuing now with the process, nitride film 22 and oxide film 21 are removed from the substrate surface as shown in FIG. 12. Referring now to FIG. 13, a p-type well region 5, a p-type base region 6, an n$^+$-type source region 7, an n$^+$-type drain region 8, a gate oxide film 9, and a gate electrode 10 are formed by the methods well known to those skilled in the art. Then, an interlayer insulation film 11, a source electrode 12, a drain electrode 13, and a passivation film 14 are formed. Thus, a lateral trench-type MOSFET as shown in FIG. 1 is obtained.

Since the impurity ions are implanted individually into the portion of substrate 1 along the side wall of trench 2 and into the portion of substrate 1 beneath the bottom wall of trench 2, the impurity concentrations in the respective portions are optimized according to the first embodiment of the invention. Since trench 2 is filled with oxide 4, a lateral trench-type MOSFET exhibiting a high breakdown voltage of several hundreds volt is obtained, and the tradeoff relation between the breakdown voltage and the on-resistance per a unit area is reduced.

Since p-type well region 5 and p-type base region 6, both doped more heavily than substrate 1 such that the conductivity type thereof is opposite to that of n$^-$-type offset drain region 3, are in adjacent to the portion of n$^-$-type offset drain region 3 along the side wall of trench 2, the portion of n$^-$-type offset drain region 3 along the side wall of trench 2 can be doped more heavily than the portion of n$^-$-type offset drain region 3 beneath the bottom wall of trench 2. In the semiconductor device including a field plate or field plates in trench 2, the portion of n$^-$-type offset drain region 3 along the side wall of trench 2 can be doped more heavily than the portion of n$^-$-type offset drain region 3 beneath the bottom wall of trench 2. By doping n$^-$-type offset drain region 3 as described above, the tradeoff relation between the breakdown voltage and the on-resistance per a unit area is further reduced.

Second Embodiment

Now a second process for manufacturing a semiconductor device as shown in FIG. 1 will be described with reference to FIGS. 14 through 16, which describe the specific intermediate structures of the semiconductor device under construction according to a second embodiment of the invention. Throughout these figures, the same reference numerals as used in FIGS. 1 through 13 are used to designate the same constituent elements and their duplicated descriptions are omitted for the sake of simplicity. A trench 2 is formed in a semiconductor substrate 1 in the same way as according to the first embodiment described earlier with reference to FIGS. 2 through 7, and trench 2 is filled with an oxide film in the same way as according to the first embodiment described earlier with reference to FIGS. 12 and 13.

Figure 14:
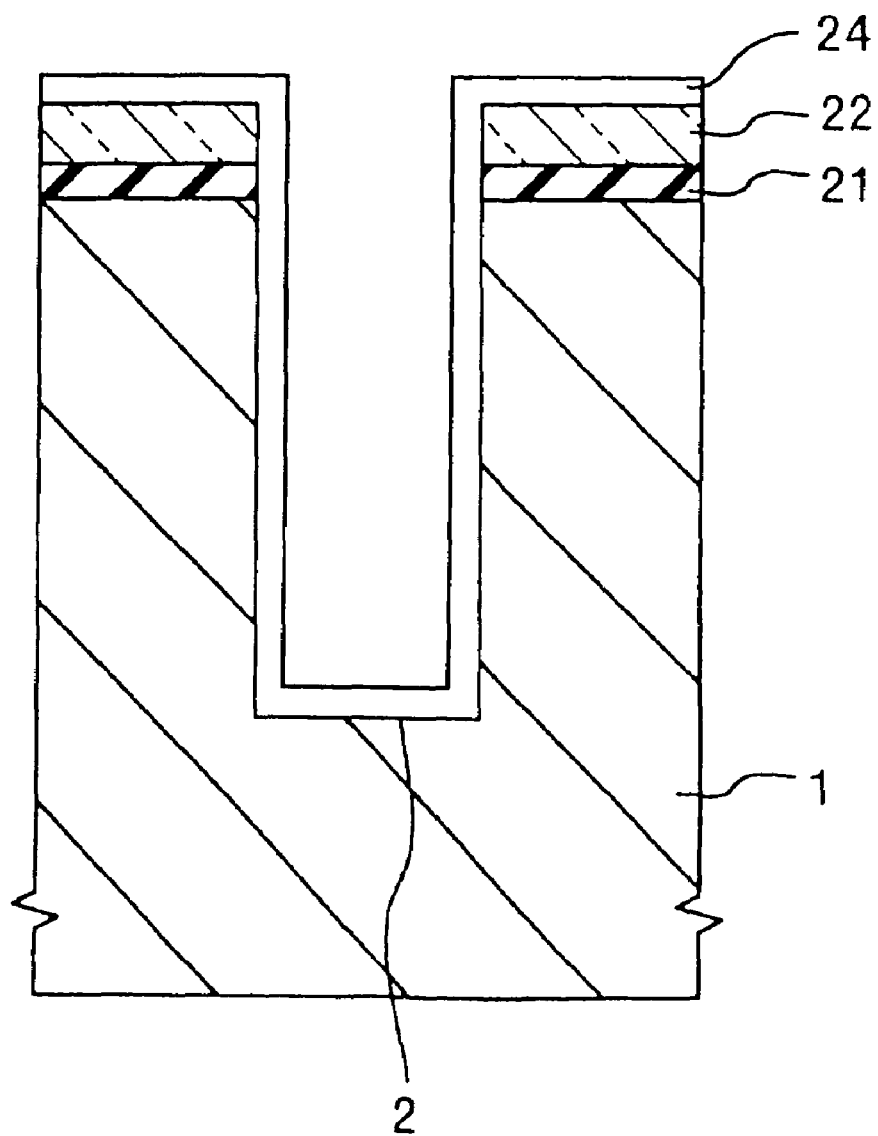
FIG. 14 is a cross sectional view describing the step of forming a doped polycrystalline silicon film covering the semiconductor substrate and the trench according to the second embodiment of the invention.

Referring now to FIG. 14, a doped polycrystalline silicon film 24 is deposited, after forming trench 2, by the vacuum CVD method using silane and phosphine for phosphorus ion doping. Doped polycrystalline silicon film 24 contains phosphorus atoms ($P_{31}$) at the concentration of $1 \times 10^{20}$ cm$^{-3}$. Doped polycrystalline silicon film 24 is 300 Å in thickness.

Figure 15:
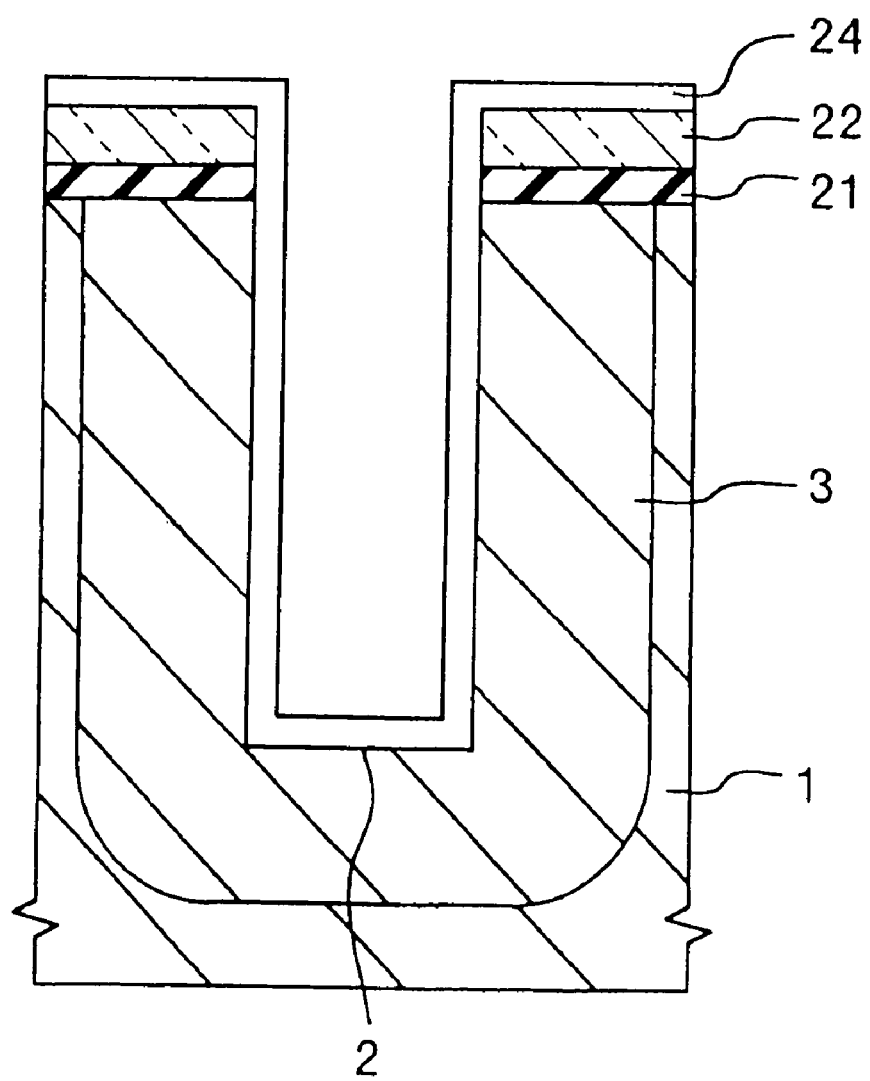
FIG. 15 a cross sectional view describing the step of forming an impurity diffusion layer around the trench according to the second embodiment.

Referring now to FIG. 15, the doped phosphorus atoms are driven at 1150 C for 120 min. The phosphorus atoms diffuse (through solid phase diffusion) into the portion of substrate 1 along the side wall of trench 2 and the portion of substrate 1 beneath the bottom wall of trench 2, resulting in an n-type impurity diffusion layer 3. The diffusion depth of resulting n-type impurity diffusion layer 3 is 3 microns, and the peak impurity concentration in resulting n-type impurity diffusion layer 3 is $1 \times 10^{16}$ cm$^{-3}$.

Figure 16:
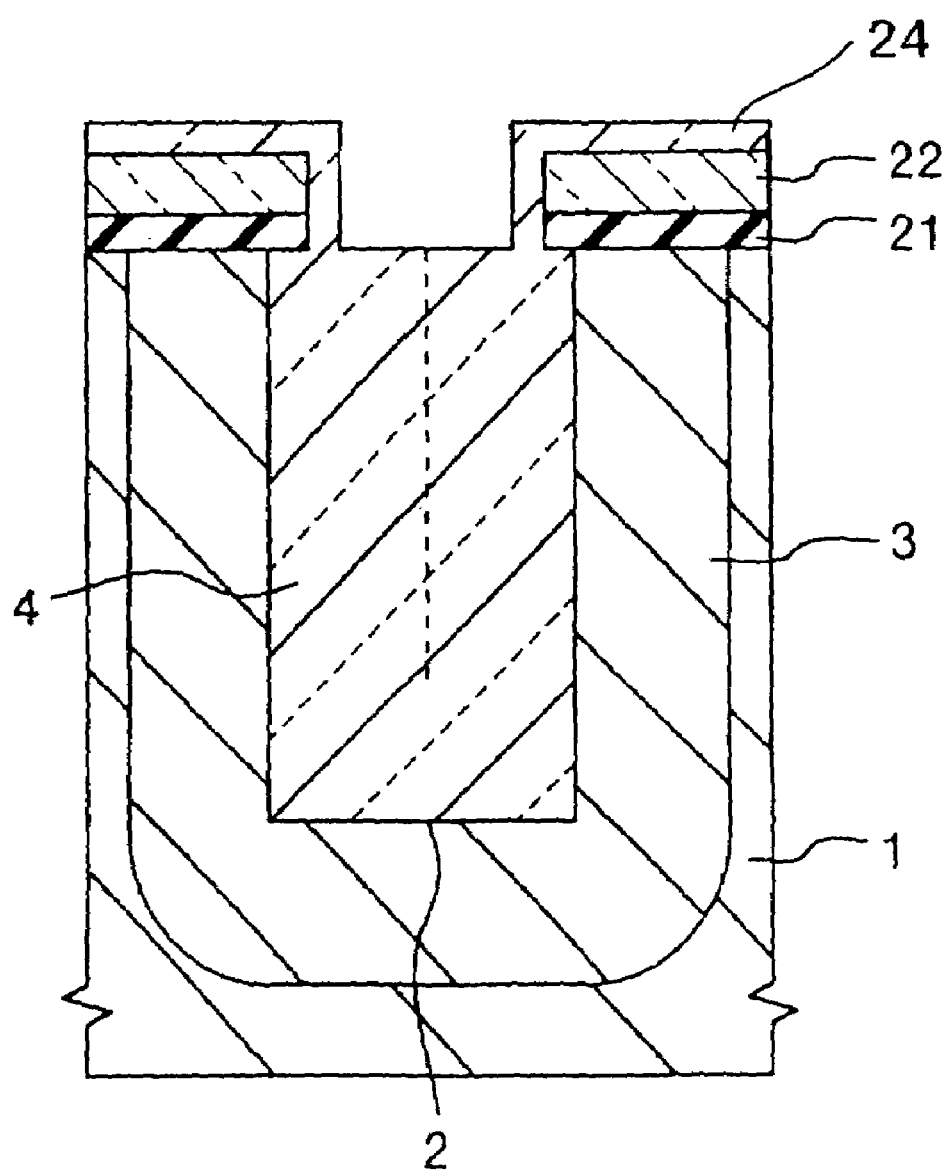
FIG. 16 is a cross sectional view describing the step of thermally oxidizing the doped polycrystalline silicon film and filling the trench with an oxide film according to the second embodiment.

As shown in FIG. 16, substrate 1 is heated to convert doped polycrystalline silicon film 24 to a thermal oxide film. Substrate 1 is further heated until trench 2 is filled with an oxide film. Then, the oxide film formed by the oxidation of doped polycrystalline silicon film 24, nitride film 22 and oxide film 21 are removed. The intermediate structure at this stage is the same as that described in FIG. 12 in connection with the first embodiment. Accordingly, a diffusion layer is formed around the trench with excellent controllability.

Third Embodiment

Now a third process for manufacturing a semiconductor device as shown in FIG. 1 will be described with reference to FIGS. 17 through 20, which describe the specific intermediate structures of the semiconductor device under construction according to a third embodiment of the invention. Throughout these figures, the same reference numerals as used in FIGS. 1 through 16 are used to designate the same constituent elements and their duplicated descriptions are omitted for the sake of simplicity. A trench 2 is formed in a semiconductor substrate 1, and oblique ion implantation and parallel ion implantation are conducted in the same way as according to the first embodiment described earlier with reference to FIGS. 2 through 10. Alternatively, a trench 2 is formed in semiconductor substrate 1, a doped polycrystalline silicon film 24 is formed and the doped phosphorus atoms are driven in the same way as according to the second embodiment. In the semiconductor device manufactured by the method according to the third embodiment, trench 2 is 7 microns in width and 20 microns in depth. Therefore, the impurity ions are implanted at 19 degrees of angle with the normal of the substrate surface.

Figure 17:
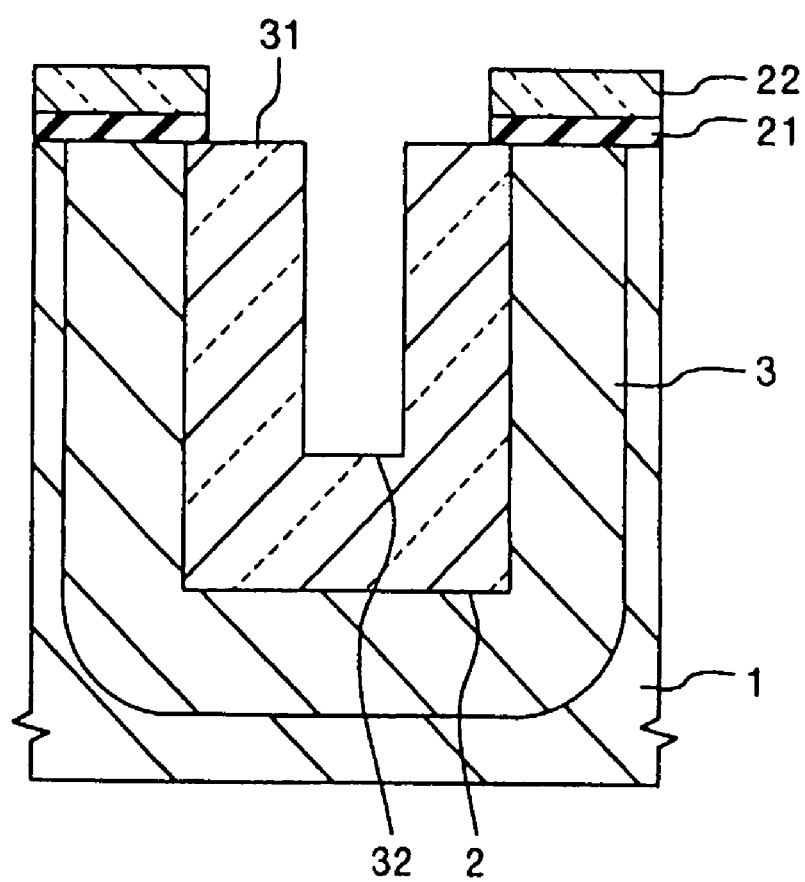
FIG. 17 is a cross sectional view describing the steps of forming an offset drain region around the trench and forming an oxide film in the trench according to the third embodiment of the invention.

Referring now to FIG. 17, the implanted impurity ions are thermally driven, resulting in an n-type offset drain region 3 and thermal oxide films 31 of 2 microns in thickness on the side wall and the bottom wall of trench 2. Trench 2 is not completely filled with thermal oxide films 31 leaving a trench 32 of around 4 microns in width in the central portion of trench 2. In other words, the width of trench 2 is narrowed. Note that, doped polycrystalline silicon film 24 is oxidized and the resulting oxide film covering nitride film 22 is removed according to the second embodiment. The intermediate structure at this stage is the same as that described in FIG. 17.

Figure 18:
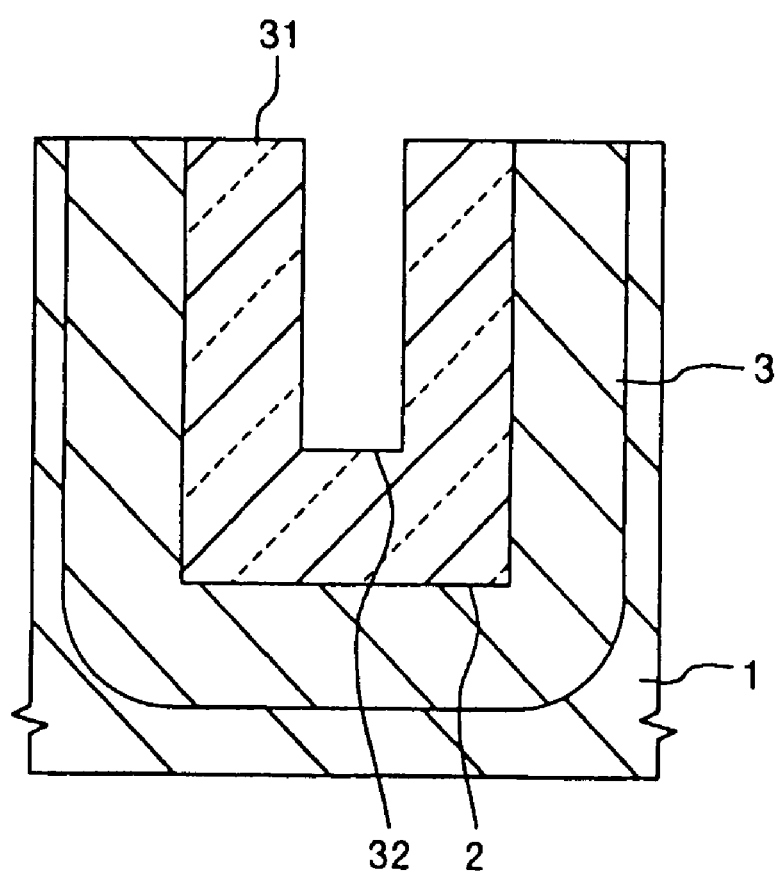
FIG. 18 is a cross sectional view describing the step of removing the nitride film and the oxide film from the substrate surface according to the third embodiment.
Figure 19:
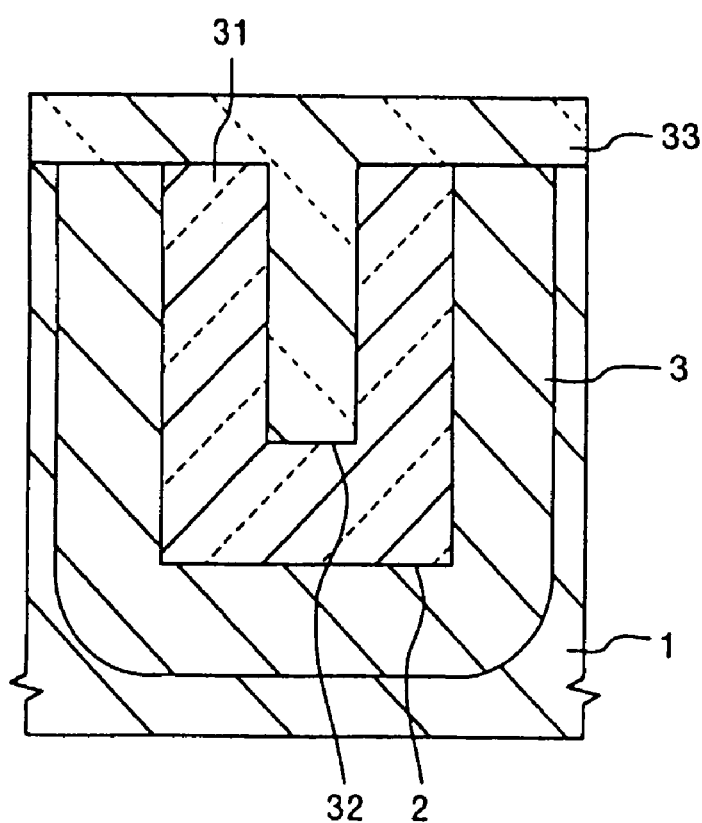
FIG. 19 is a cross sectional view describing the step of forming another oxide film on the substrate surface and on the oxide film remaining in the trench according to the third embodiment.
Figure 20:
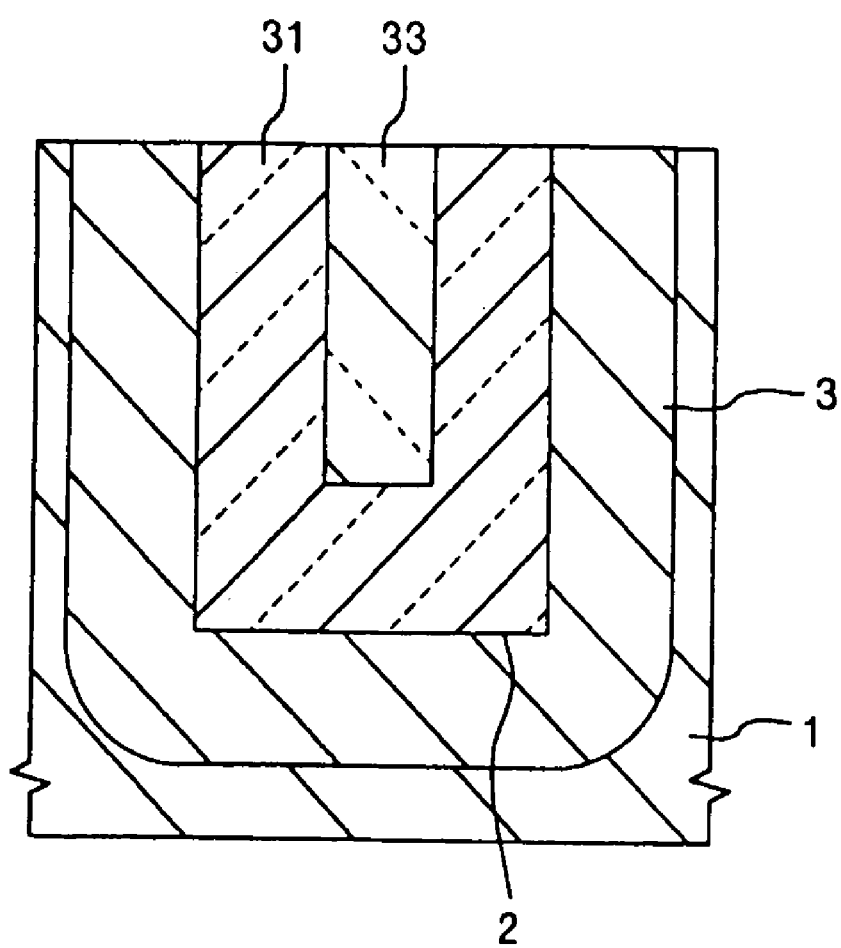
FIG. 20 is a cross sectional view describing the step of removing the other oxide film from the substrate surface according to the third embodiment.

As shown in FIG. 18, nitride film 22 and oxide film 21 are removed. An oxide film 33 such as a TEOS and an HTO is deposited on the substrate surface to fill the remaining trench 32 as shown in FIG. 19. Then, oxide film 33 is partially removed from the substrate surface such that oxide film 33 is remaining only in trench 32 as shown in FIG. 20.

Although not described with reference to the drawing figures, a p-type well region 5, a p-type base region 6, an n$^+$-type source region 7, an n$^+$-type drain region 8, a gate oxide film 9, a gate electrode 10, an interlayer insulation film 11, a source electrode 12, a drain electrode 13, and a passivation film 14 are formed. Thus, a lateral trench-type MOSFET as shown in FIG. 1 is obtained.

By the manufacturing method according to the third embodiment, a lateral trench-type MOSFET exhibiting a high breakdown voltage of several hundreds volt is obtained in the same way as by the manufacturing method according to the first embodiment or the second embodiment. In addition, trench 2 wider than that according to the first embodiment or the second embodiment is filled with oxide films 31 and 33 by the manufacturing method according to the third embodiment.

Fourth Embodiment

Now a fourth process for manufacturing a semiconductor device as shown in FIG. 1 will be described with reference to FIGS. 21 through 23, which describe the specific intermediate structures of the semiconductor device under construction according to a fourth embodiment of the invention. Throughout these figures, the same reference numerals as used in FIGS. 1 through 13 are used to designate the same constituent elements and their duplicated descriptions are omitted for the sake of simplicity.

Figure 21:
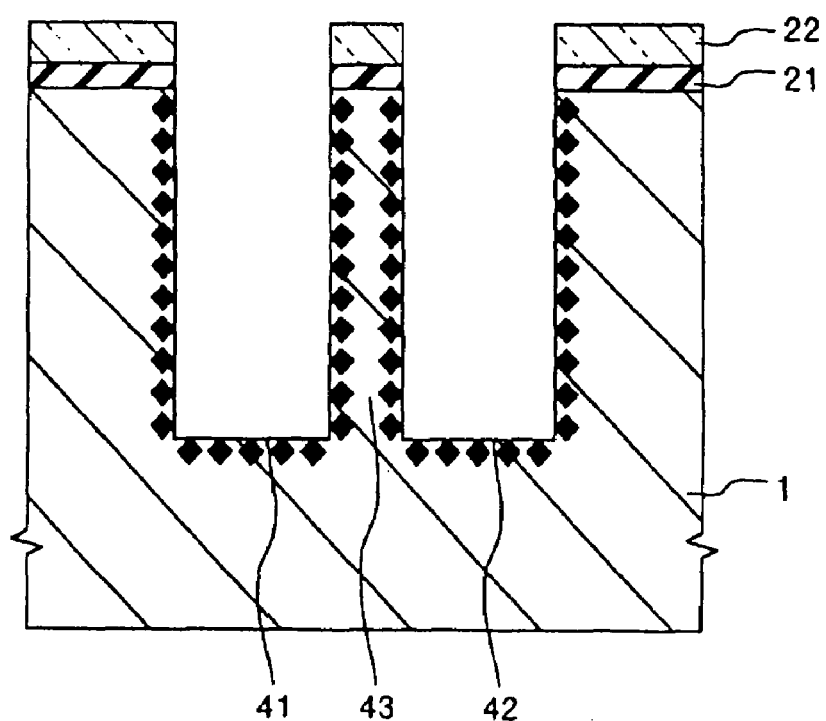
FIG. 21 is a cross sectional view schematically showing the distribution of the implanted impurity atoms according to the fourth embodiment of the invention.

Referring now to FIG. 21, trenches 41 and 42 are formed in a semiconductor substrate 1 with an extended portion 43 of semiconductor substrate 1 of 2 microns in thickness interposed therebetween, and oblique ion implantation and parallel ion implantation are conducted in the same way as according to the first embodiment described earlier with reference to FIGS. 2 through 10. Trenches 41 and 42 are the same with trench 2 in the semiconductor device according to the first embodiment. In detail, trenches 41 and 42 are 5 microns in width and 20 microns in depth.

Figure 22:
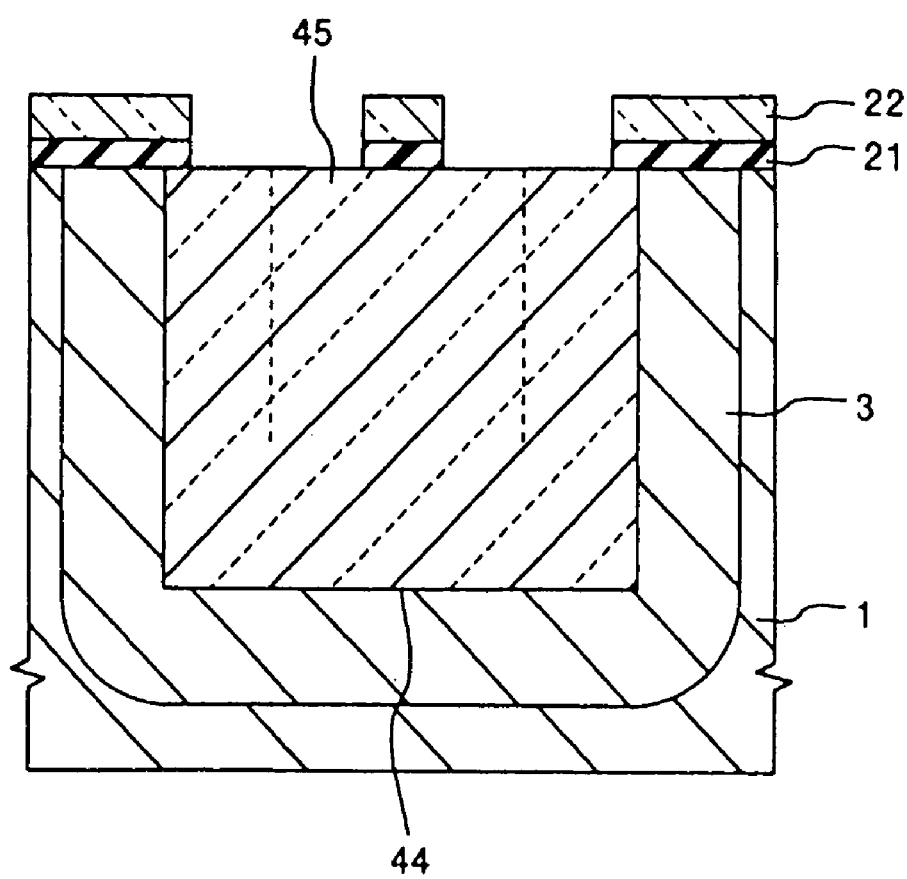
FIG. 22 is a cross sectional view describing the steps of forming an offset drain region around the trench and forming oxide films in the trench according to the fourth embodiment.
Figure 23:
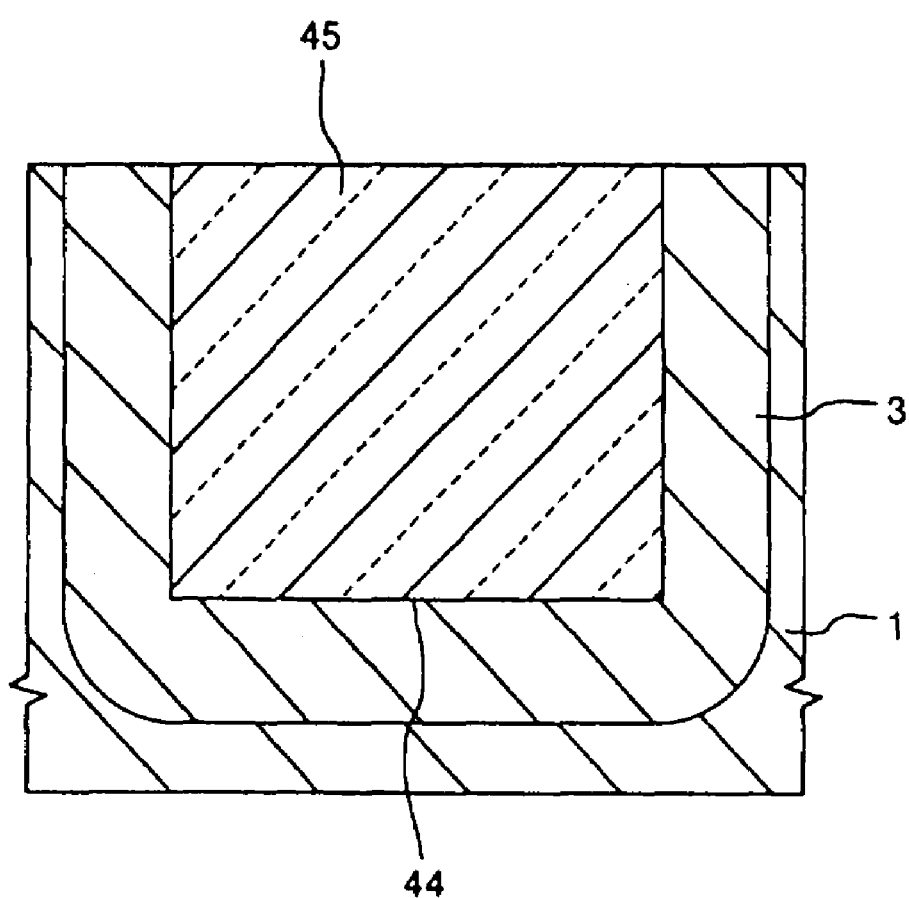
FIG. 23 is a cross sectional view describing the step of removing the nitride film and the oxide film from the substrate surface according to the fourth embodiment.

Referring now to FIG. 22, the implanted impurity ions are thermally driven to form an n$^-$-type offset drain region 3. At the same time, thermal oxide films of 4 microns in thickness are formed on the side walls and the bottom walls of trench 41 and 42. The thermal oxide films of 4 microns in thickness fill trench 41 and 42 completely, and extended portion 43 of substrate 1 of 2 microns in thickness is converted to a thermal oxide film of 4 microns in thickness. Therefore, the thermal oxide films formed in trench 41 and the thermal oxide films formed in trench 42 are connected to each other via the thermal oxide film formed by the thermal oxidation of extended portion 43 of substrate 1. As a result, a trench 44 of around 15 microns in width is filled with an oxide 45. The n$^-$-type offset drain region 3 is formed around trench 44 of around 15 microns in width. Two broken lines extending in the depth direction of oxide 45 represent the virtual boundaries at which the thermal oxide films grown from the side walls and the bottom walls of the respective trenches 41 and 42 join. As shown in FIG. 23, nitride film 22 and oxide film 21 are then removed.

Although not described with reference to the drawing figures, a p-type well region 5, a p-type base region 6, an n$^+$-type source region 7, an n$^+$-type drain region 8, a gate oxide film 9, a gate electrode 10, an interlayer insulation film 11, a source electrode 12, a drain electrode 13, and a passivation film 14 are formed. Thus, a lateral trench-type MOSFET as shown in FIG. 1 is obtained.

Fifth Embodiment

Now a fifth process for manufacturing a semiconductor device as shown in FIG. 1 will be described with reference to FIGS. 24 through 26, which describe the specific intermediate structures of the semiconductor device under construction according to a fifth embodiment of the invention. Throughout these figures, the same reference numerals as used in FIGS. 14 through 16 are used to designate the same constituent elements and their duplicated descriptions are omitted for the sake of simplicity.

Figure 24:
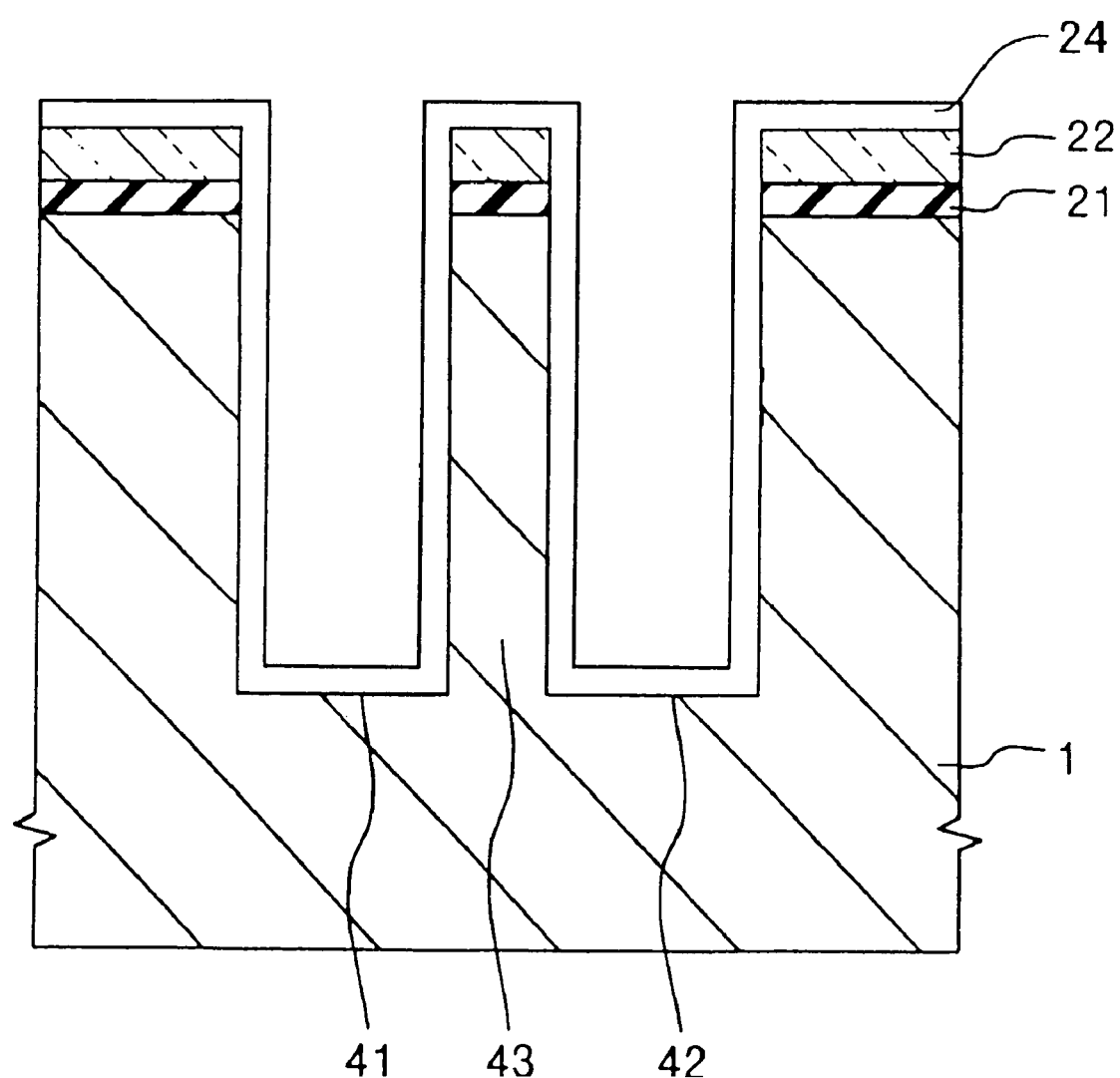
FIG. 24 is a cross sectional view describing the step of forming a doped polycrystalline silicon film covering the semiconductor substrate and the trenches according to the fifth embodiment of the invention.

Referring now to FIG. 24, trenches 41 and 42 are formed in a semiconductor substrate 1 with an extended portion 43 of substrate 1 of 2 microns in thickness interposed therebetween in the same way as according to the fourth embodiment and a doped polycrystalline silicon film 24 is formed in the same manner as according to the second embodiment described with reference to FIGS. 14 through 16. Trenches 41 and 42 are the same with trench 2 in the semiconductor device according to the second embodiment. In detail, trenches 41 and 42 are 5 microns in width and 20 microns in depth.

Figure 25:
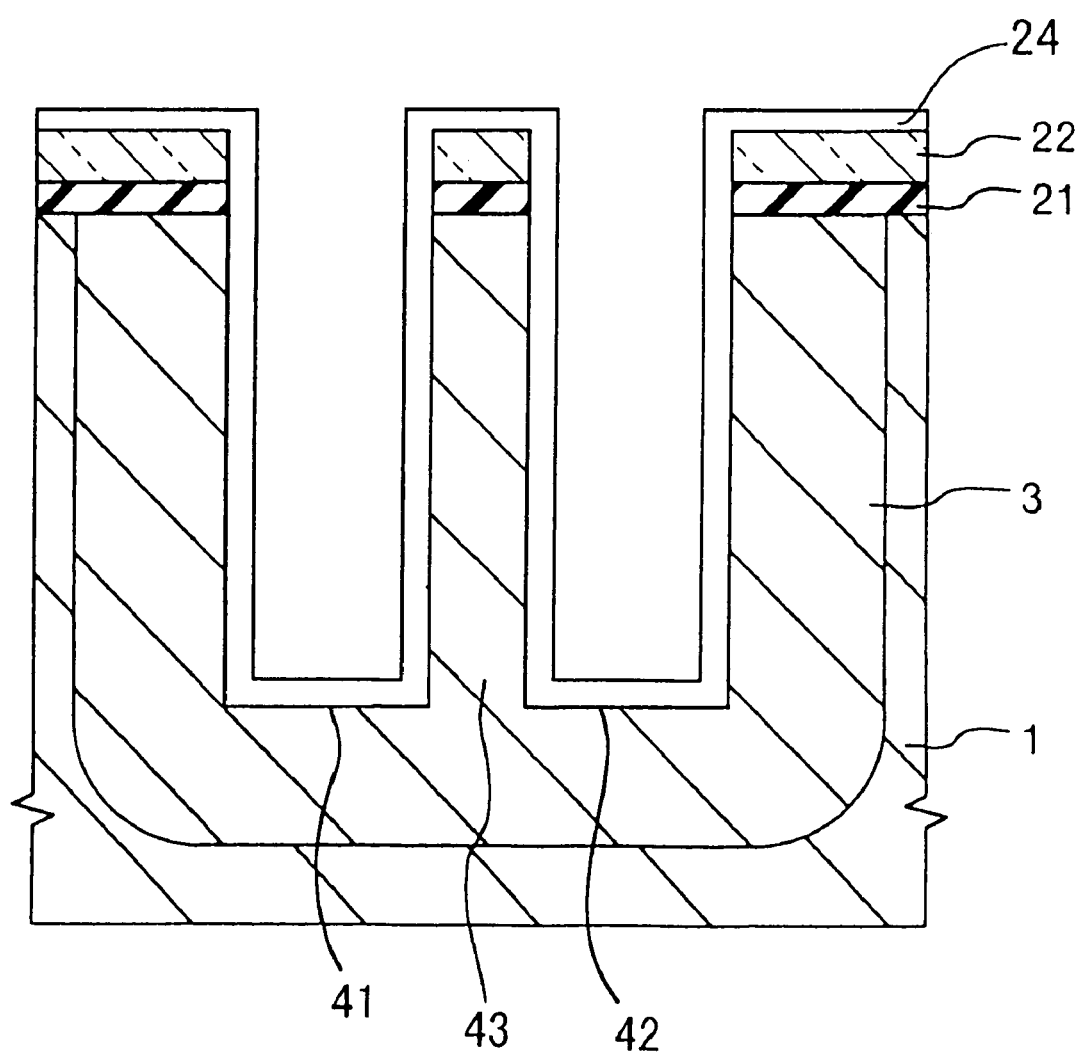
FIG. 25 is a cross sectional view describing the step of forming an impurity diffusion layer around the trenches according to the fifth embodiment.

Referring now to FIG. 25, the doped impurity atoms are driven at 1150 C for 120 min. The impurity atoms diffuse (through solid phase diffusion) into the portions of substrate 1 along the side walls of trenches 41 and 42 and the portions of substrate 1 beneath the bottom walls of trenches 41 and 42, resulting in an n-type impurity diffusion layer 3. The diffusion depth of the resulting n-type impurity diffusion layer 3 is 3 microns, and the peak impurity concentration in n-type impurity diffusion layer 3 is $1 \times 10^{16}$ cm$^{-3}$.

Figure 26:
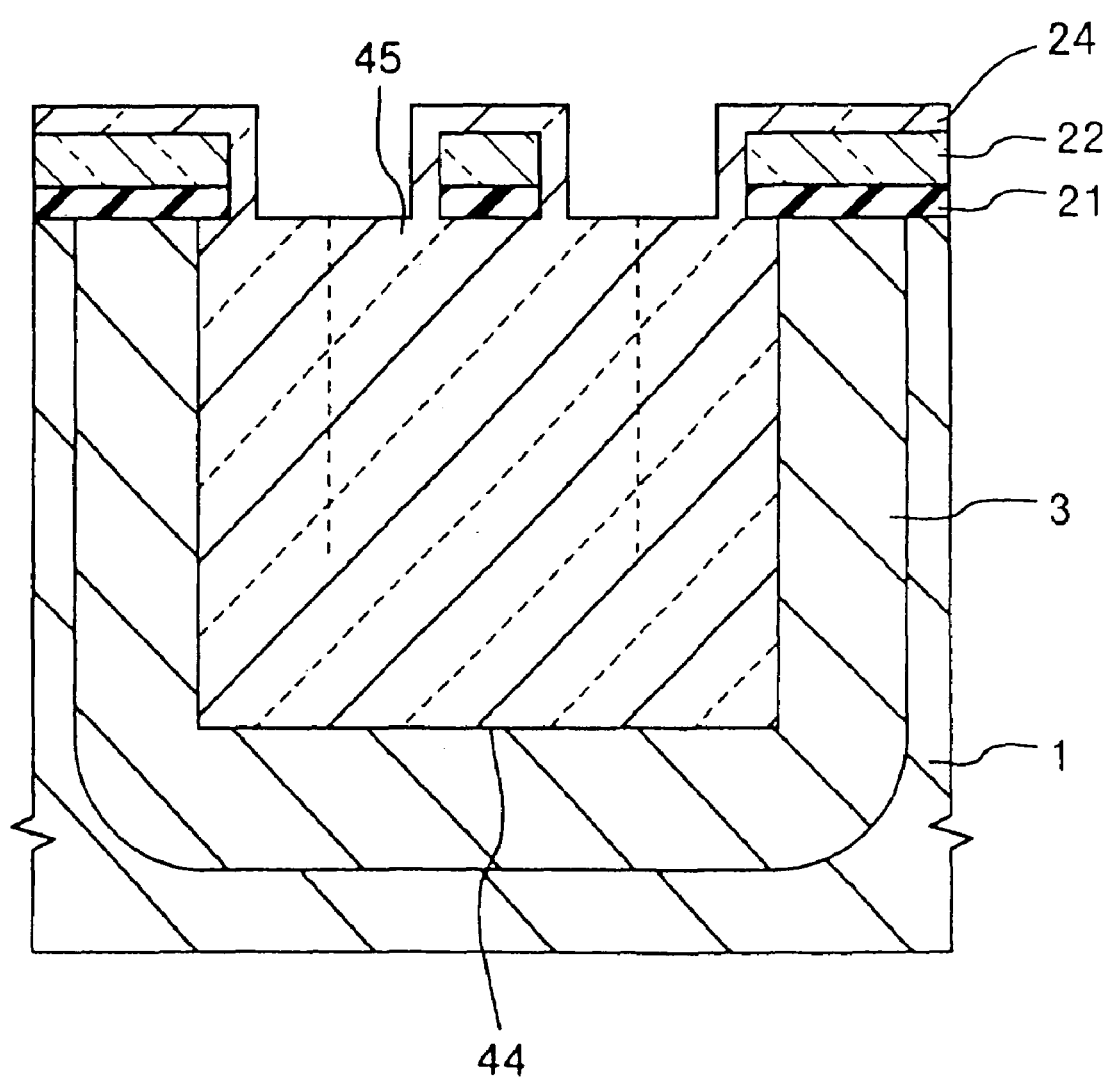
FIG. 26 is a cross sectional view describing the step of thermally oxidizing the doped polycrystalline silicon film and filling the trench with an oxide film according to the second embodiment.

Referring now to FIG. 26, substrate 1 is further heated to convert doped polycrystalline silicon film 24 to a thermal oxide film. Substrate 1 is heated until trench 44 is filled with an oxide film 45. Then, the oxide film formed on substrate 1 by the oxidation of doped polycrystalline silicon film 24, nitride film 22 and oxide film 21 are removed. The intermediate structure at this stage is the same as that described in FIG. 12 in connection with the first embodiment. Trenches 41 and 42 are filled completely with oxide film 45. The broken lines in FIG. 26 represent virtual boundaries, at which the thermal oxide films growing from the side walls of trenches 41 and 42 join.

By the manufacturing methods according to the fourth and fifth embodiments, a lateral trench-type MOSFET exhibiting a high breakdown voltage of several hundreds volt is obtained in the same way as by the manufacturing methods according to the first and second embodiments. In addition, trench 44 wider than the trenches according to the first through third embodiments is filled with oxide 45 by the manufacturing methods according to the fourth and fifth embodiments.

Sixth Embodiment

Figure 28:
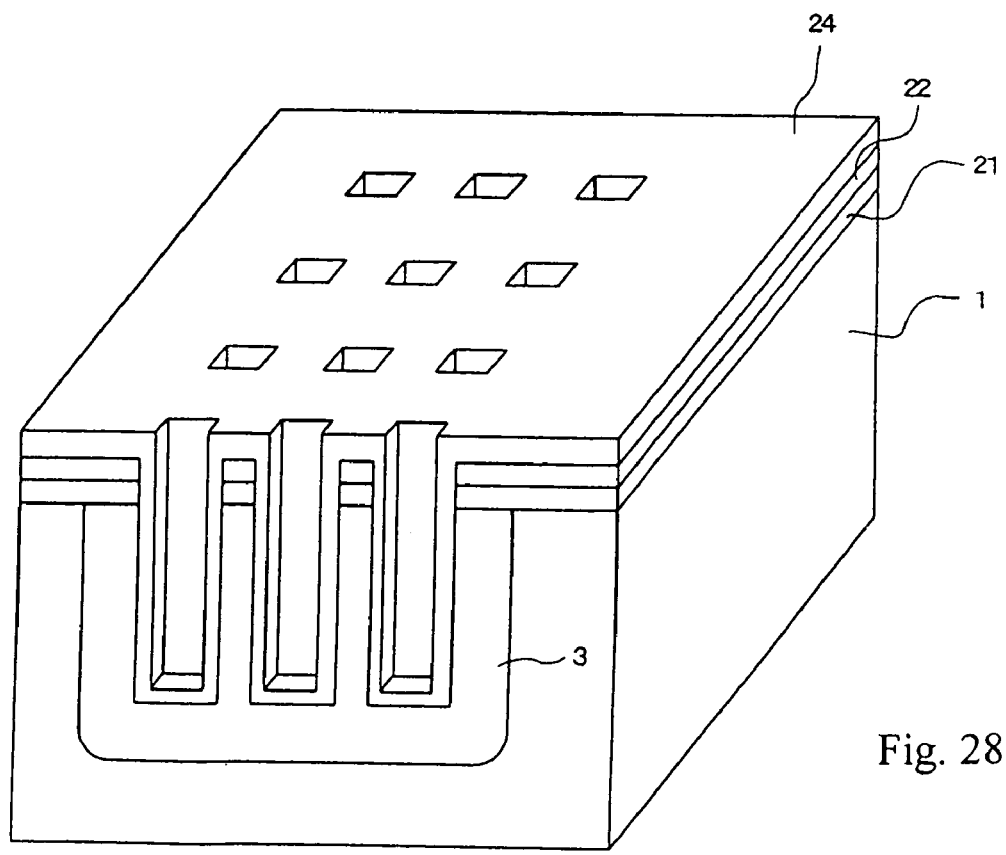
FIG. 28 is a perspective view describing the step of forming a doped polycrystalline silicon film covering the semiconductor substrate and the trenches according to the sixth embodiment.
Figure 29:
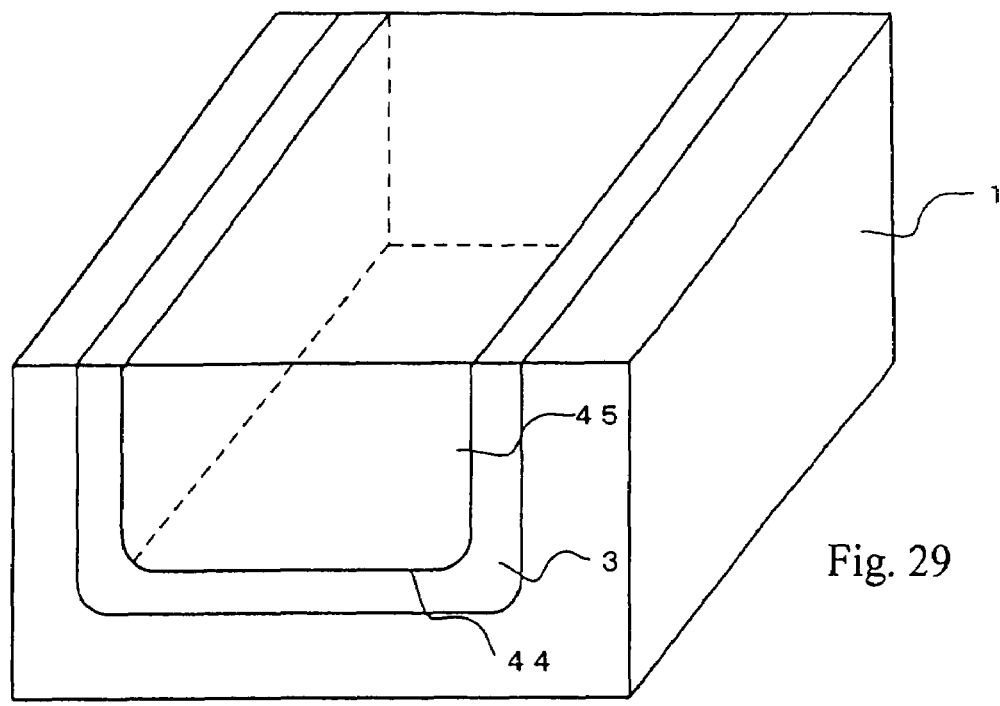
FIG. 29 is a perspective view describing the step of forming a wide trench filled with an oxide according to the sixth embodiment.

Now a sixth process for manufacturing a semiconductor device will be described with reference to FIGS. 27 through 29, which describe the specific intermediate structures of the semiconductor device under construction according to a sixth embodiment of the invention. The semiconductor device manufactured by the method according to the sixth embodiment is different from the semiconductor device according to the fifth embodiment in that the semiconductor device according to the sixth embodiment includes a plurality of trenches arranged at the lattice points of a two-dimensional lattice. The steps for manufacturing the semiconductor device according to the sixth embodiment are almost the same with the steps for manufacturing the semiconductor device according to the fifth embodiment.

Figure 27:
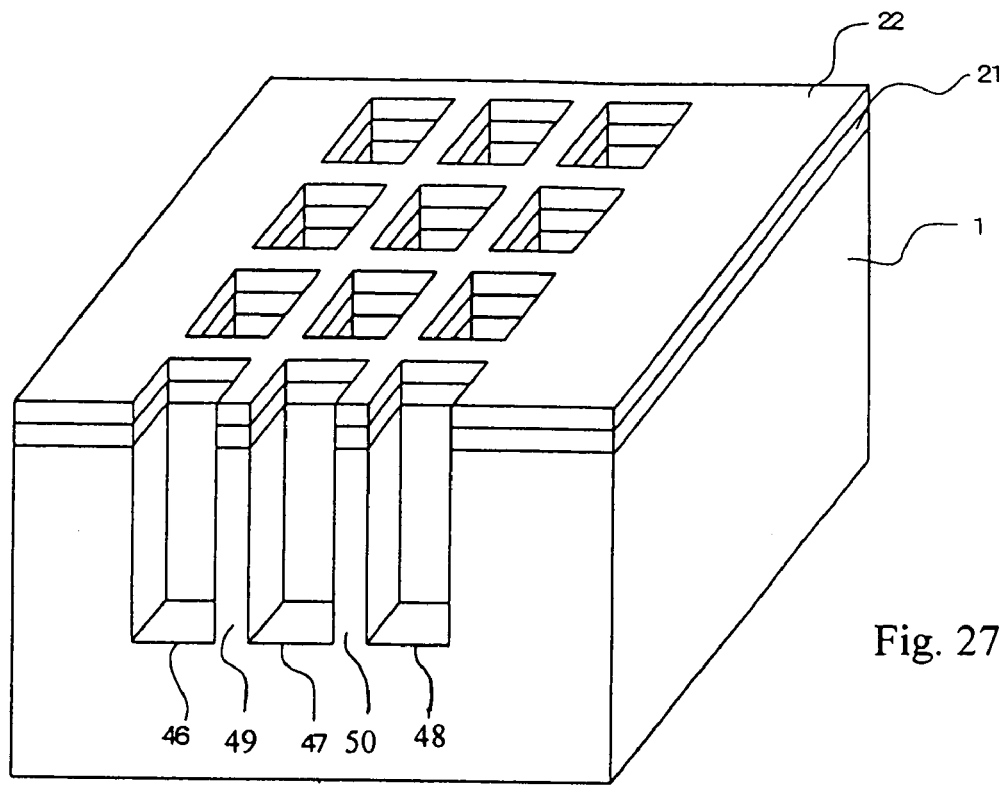
FIG. 27 is a perspective view describing the step of forming a plurality of trenches at the lattice points of a two-dimensional lattice according to the sixth embodiment of the invention.

Referring now to FIG. 27, trenches 46, 47 and 48 are formed by etching at the lattice points of a two-dimensional lattice (typically, a square lattice). As shown in FIG. 28, a doped polycrystalline silicon film 24 is formed and the impurity contained in doped polycrystalline silicon film 24 is driven to form an impurity diffusion layer 3. Referring now to FIG. 29, substrate 1 is heated to thermally oxidize doped polycrystalline silicon film 24. Substrate 1 is further heated until a wide trench 44 filled with an oxide 45 is obtained.

When trenches 41 and 42 in the semiconductor device according to the fifth embodiment are long, the thin extended portion 43 between trenches 41 and 42 happens to bend or turn over between the step of forming the trenches and the step of forming the doped polycrystalline silicon film.

When trenches 46, 47 and 48 are at the lattice points of a two dimensional lattice (square typically) as according to the sixth embodiment, the extended portion 49 between trenches 46 and 47 and the extended portion 50 between trenches 47 and 48 are prevented from bending or turning over.

According to the sixth embodiment, impurity diffusion layer 3 is formed by forming a doped polycrystalline silicon film 24 and by driving the impurity contained in doped polycrystalline silicon film 24. Alternatively, impurity diffusion layer 3 is formed by double ion implantation and by driving the implanted impurity atoms in the same way as according to the first and the fourth embodiments. However, when the trench is shaped two dimensionally with a stripe, the projection of the ion beam irradiated obliquely to the rotating substrate coincides periodically with the extending direction of the stripe. Every time when the projection of the ion beam irradiated obliquely to the rotating substrate coincides with the extending direction of the trench stripe, the impurity ions happen to be irradiated to portion of the bottom wall near to the side wall of the trench as well as to the side wall of the trench. In contrast, when square trenches or square like trenches are arranged at the lattice points of a two-dimensional square lattice or a two-dimensional rectangular lattice, the impurity ions are implanted to the portions of the semiconductor substrate along the side walls of the trenches with excellent controllability by determining the angle between the ion implantation direction and the normal of the substrate surface and by irradiating the impurity ions at the determined angle to the rotating substrate.

Now the results of simulations, conducted on the distribution profiles in the depth direction of the semiconductor substrate below the trench of the semiconductor device manufactured by the method according to the fifth or sixth embodiment, will be described below with reference to FIGS. 30 through 33.

Figure 30:
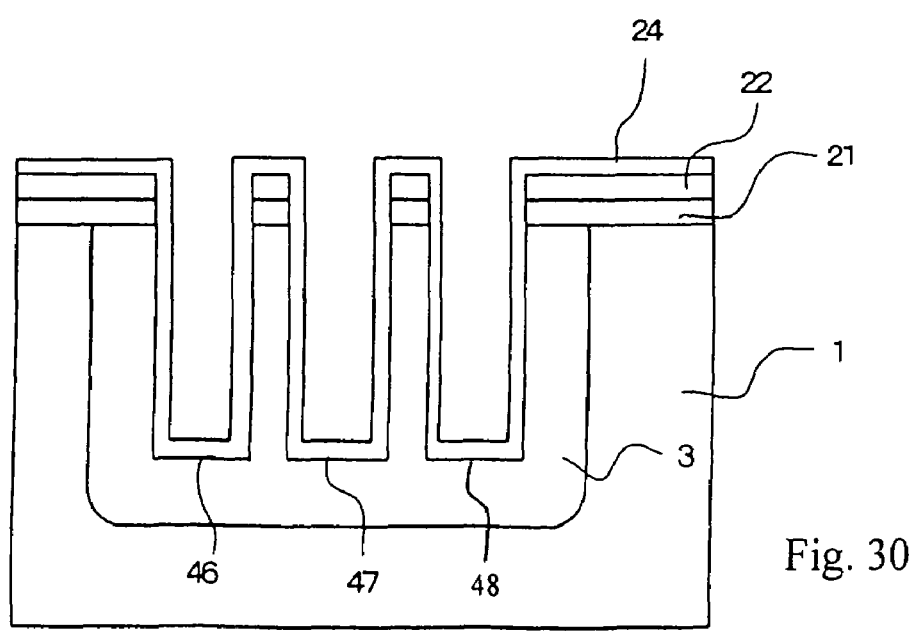
FIG. 30 is a cross sectional view of the intermediate structure of the semiconductor device, the impurity distribution profiles below the trenches thereof are simulated.

FIG. 30 is a cross sectional view of the intermediate structure of the semiconductor device, on which the simulations are conducted. The semiconductor device includes trenches 46, 47 and 48, each 20 microns in depth and 7 microns in width, and extended portions 49 and 50, 1 micron in thickness and extended between trenches 46 and 47 and between trenches 47 and 48.

Figure 31:
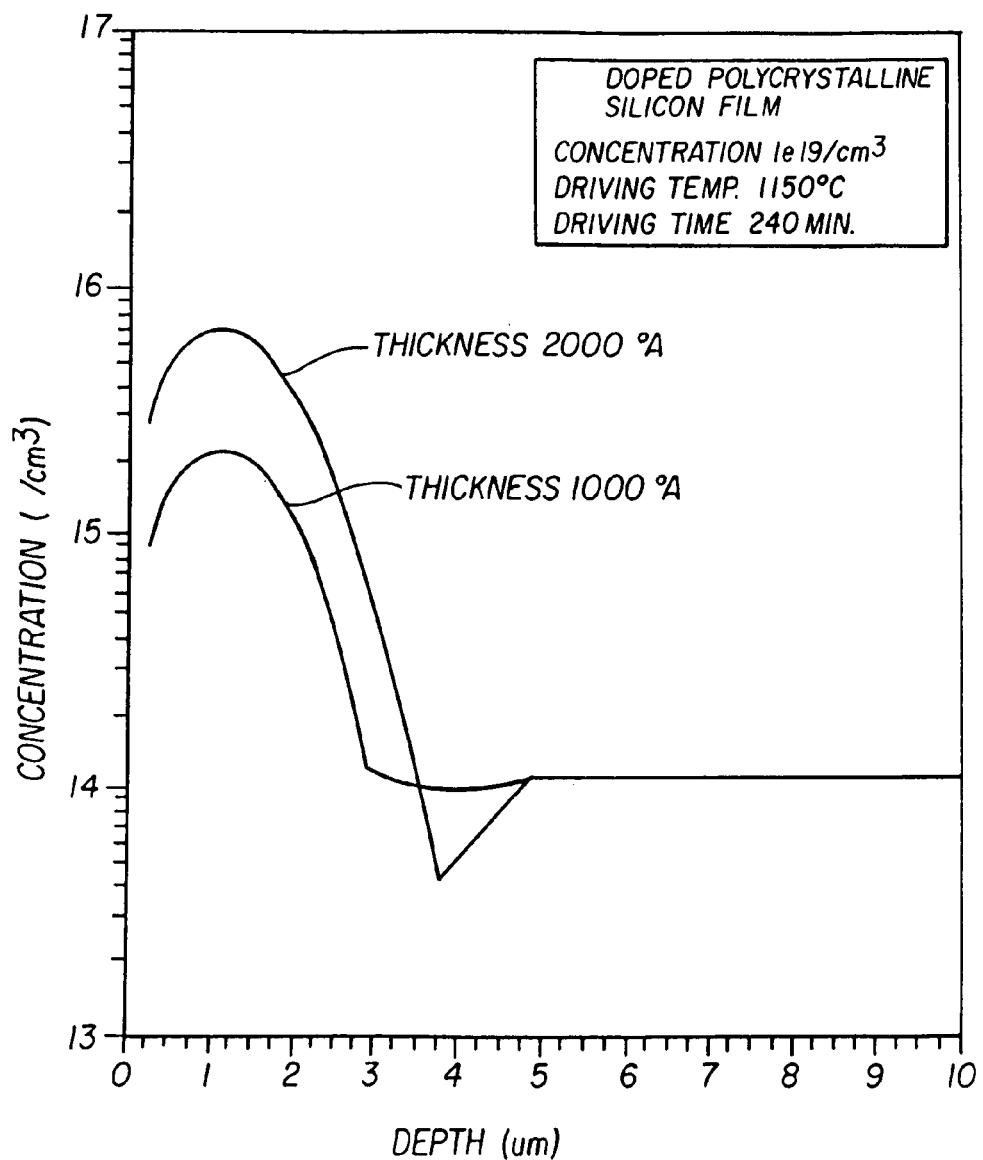
FIG. 31 is a pair of curves comparing the impurity distribution profiles obtained by changing the thickness of the polycrystalline silicon films in the trenches, by setting the impurity concentration in the polycrystalline silicon films at $1 \times 10^{19}$ cm$^{-3}$ and by driving the impurity at 1150 C for 240 min to vary the thickness of the impurity diffusion layer.

FIG. 31 is a pair of curves comparing the impurity distribution profiles obtained by changing the thickness of the polycrystalline silicon films in trenches 46, 47 and 48, by setting the impurity concentration in the polycrystalline silicon films at $1\times10^{19}$ cm$^{-3}$ and by driving the impurity at 1150 C for 240 min to vary the thickness of the impurity diffusion layer.

Figure 32:
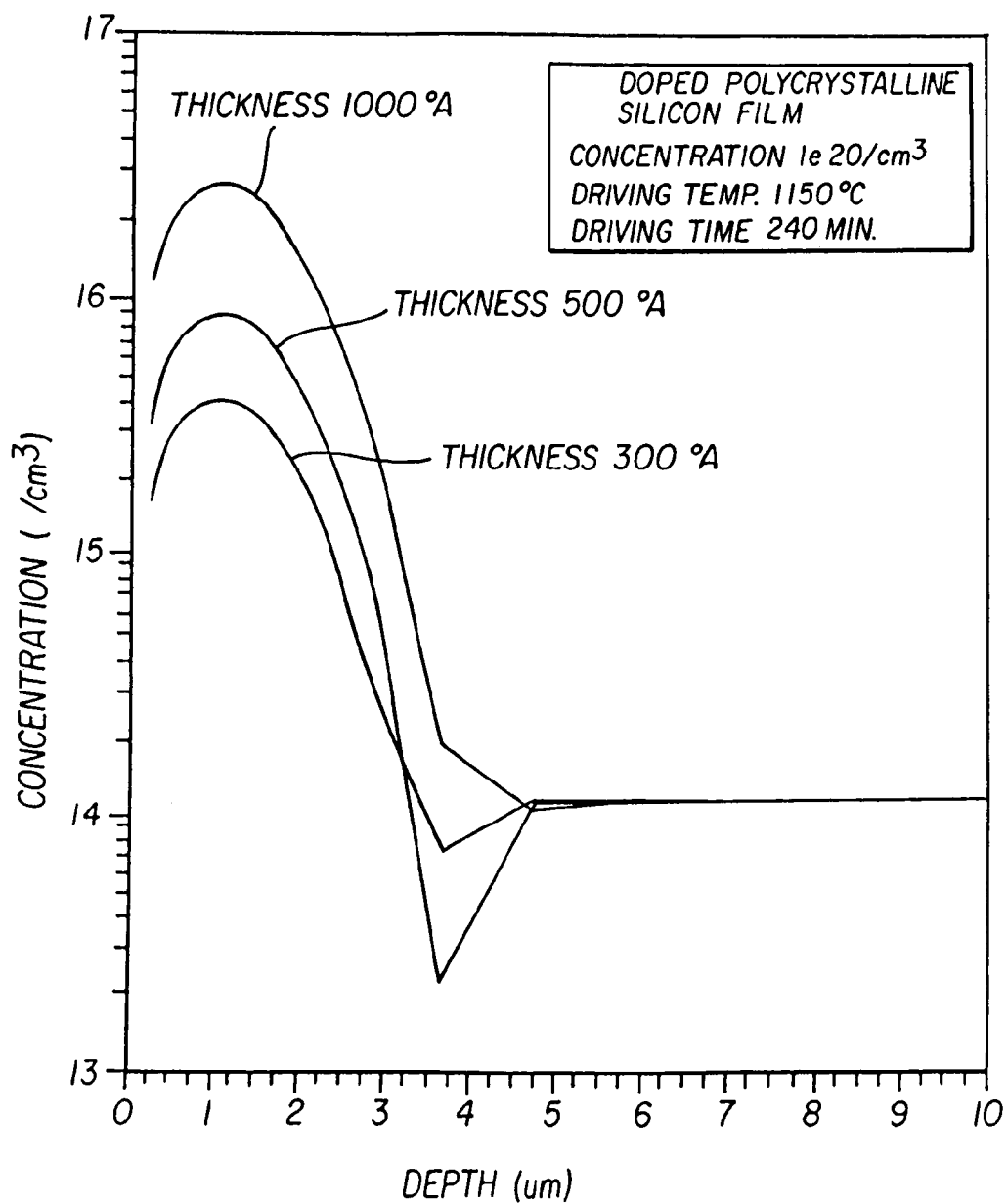
FIG. 32 is a set of curves comparing the impurity distribution profiles obtained by changing the thickness of the polycrystalline silicon films in the trenches, by setting the impurity concentration in the polycrystalline silicon films at $1 \times 10^{20}$ cm$^{-3}$ and by driving the impurity at 1150 C for 240 min.

FIG. 32 is a set of curves comparing the impurity distribution profiles obtained by changing the thickness of the polycrystalline silicon films in trenches 46, 47 and 48, by setting the impurity concentration in the polycrystalline silicon films at $1\times10^{20}$ cm$^{-3}$ and by driving the impurity at 1150 C for 240 min. As FIGS. 31 and 32 indicate, the impurity concentration in impurity diffusion layer 3 is controlled by changing the thickness of the polycrystalline silicon film deposited.

Figure 33:
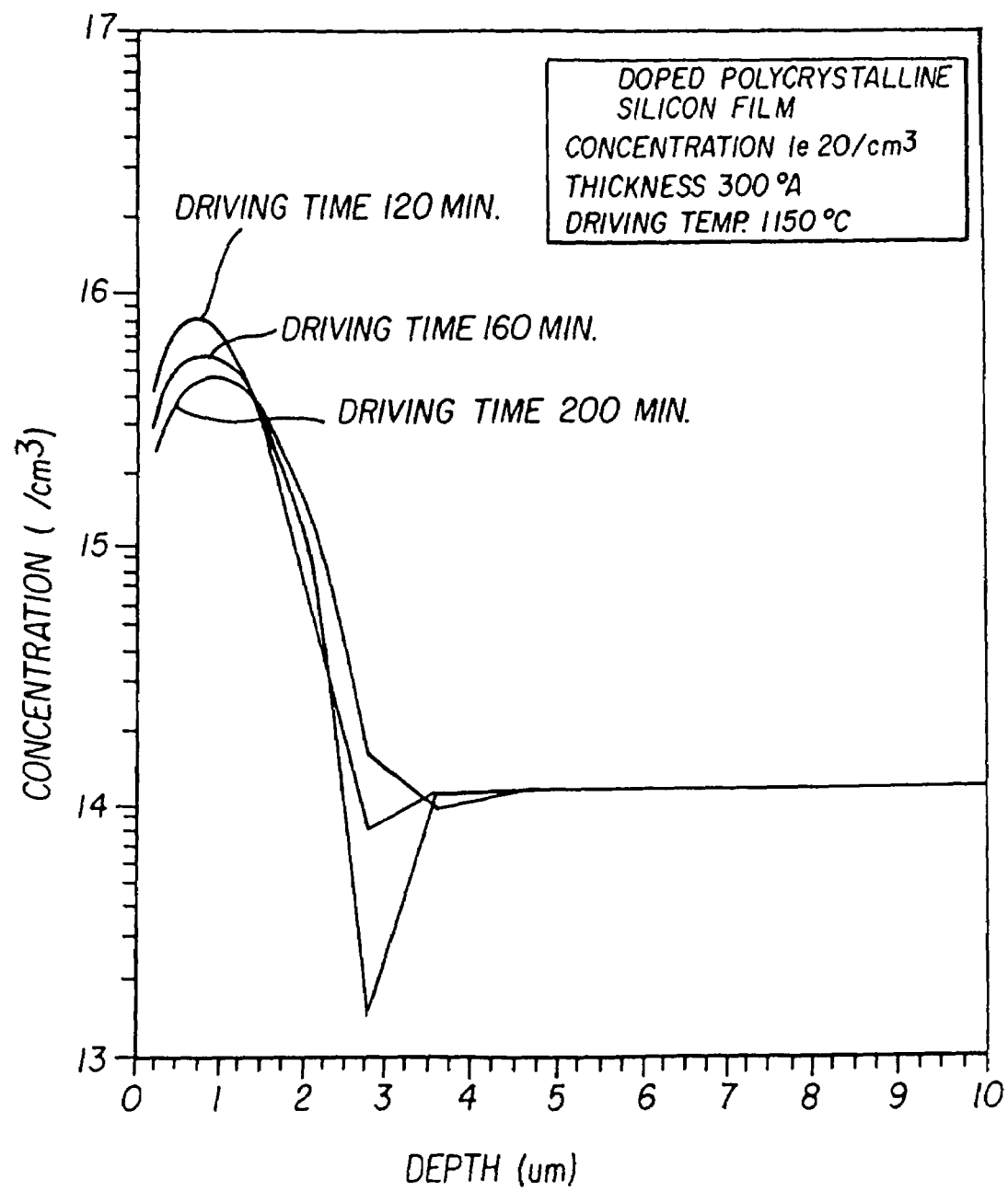
FIG. 33 is a set of curves comparing the impurity distribution profiles obtained by setting the impurity concentration in the polycrystalline silicon films in the trenches at $1 \times 10^{20}$ cm$^{-3}$ and by driving the impurity at 1150 C for various periods of time.

FIG. 33 is a set of curves comparing the impurity distribution profiles obtained by setting the impurity concentration in the polycrystalline silicon films in trenches 46, 47 and 48 at $1\times10^{20}$ cm$^{-3}$ and by driving the impurity at 1150 C for various periods of time. As FIGS. 33 indicates, the impurity concentration in impurity diffusion layer 3 is controlled by changing the period of time, for which the thermal drive is conducted.

The invention is applicable also to manufacturing a semiconductor device including an n-type substrate. The invention is applicable not only to forming a trench or trenches in a lateral trench-type MOSFET exhibiting a high breakdown voltage but widely also to forming a trench or trenches in semiconductor devices having a trench structure. The above described dimensions of the constituent elements are exemplary and the invention is applicable to the semiconductor devices, the dimensions of the constituent elements thereof are different from those described above.

Since the impurity concentration in the portion of the semiconductor substrate along the side wall of the trench and the impurity concentration in the portion of the semiconductor substrate beneath the bottom wall of the trench are controlled independently, the impurity concentrations in the offset drain region of the MOSFET exhibiting a high breakdown voltage of several hundreds volt are optimized by the double ion implantation method according to the invention. Since the wide trench is filled easily with an insulator by the manufacturing method according to the invention, the semiconductor device manufactured by the method according to the invention is provided with a high breakdown voltage. Therefore, a MOSFET exhibiting a breakdown voltage of the several hundreds volt class is obtained easily by the method according to the invention.

What is claimed is:

1. A method of manufacturing a semiconductor device comprising the steps of:
    (a) forming a trench in a semiconductor substrate;
    (b) depositing an electrically conductive film doped with impurity ions on inner walls of said trench; and
    (c) thermally treating said electrically conductive film to diffuse said impurity ions through the side walls and the bottom wall of said trench and into said semiconductor substrate.

2. The method according to claim 1, further comprising the steps of
    (d) heating said semiconductor substrate to oxidize said electrically conductive film; and
    (e) heating said semiconductor substrate to fill said trench with an oxide film.

3. The method according to claim 1, further comprising the steps of
    (d) heating said semiconductor substrate to oxidize said electrically conductive film;
    (e) heating said semiconductor substrate to form oxide films on the side walls and the bottom wall of said trench leaving a central trench in the central portion of said trench; and
    (f) depositing an oxide to fill said central trench left in said central portion of said trench with said oxide.

4. The method according to claim 1, wherein said electrically conductive film comprises a doped polycrystalline silicon film.

5. A method of manufacturing a semiconductor device comprising the steps of:
    (a) forming a plurality of trenches in a semiconductor substrate;
    (b) forming an electrically conductive film on inner walls of said trenches;
    (c) heating said semiconductor substrate to oxidize said electrically conductive film;
    (d) heating said semiconductor substrate to form oxide films on the inner walls of said trenches leaving central trenches in respective central portions of said trenches and to oxidize extended portions of said semiconductor substrate extended between adjacent ones of said trenches; and
    (e) depositing an oxide fill said central trenches left in said central portions of said trenches with said oxide.

6. The method according to claim 5, further comprising the step of
    (f) thermally treating said electrically conductive film to diffuse the impurity ions contained in said electrically conductive film into said semiconductor substrate, said thermal treating being conducted between said steps (b) and (c).

7. The method according to claim 5, wherein said trenches are positioned at the lattice points of a two dimensional lattice.

8. The method according to claim 5, wherein said electrically conductive film comprises a doped polycrystalline silicon film.

* * * * *